(12) United States Patent
Kang

(10) Patent No.: US 10,490,637 B2
(45) Date of Patent: Nov. 26, 2019

(54) SEMICONDUCTOR DEVICES INCLUDING AN ACTIVE FIN AND A DRIFT REGION

(71) Applicant: Samsung Electronics Co., Ltd., Suwon-si, Gyeonggi-do (KR)

(72) Inventor: Dae Lim Kang, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 24 days.

(21) Appl. No.: 15/608,395

(22) Filed: May 30, 2017

(65) Prior Publication Data
US 2018/0012967 A1   Jan. 11, 2018

(30) Foreign Application Priority Data

Jul. 8, 2016  (KR) ........................ 10-2016-0086964

(51) Int. Cl.
| | |
|---|---|
| H01L 29/06 | (2006.01) |
| H01L 29/10 | (2006.01) |
| H01L 29/40 | (2006.01) |
| H01L 29/66 | (2006.01) |
| H01L 29/78 | (2006.01) |

(Continued)

(52) U.S. Cl.
CPC .... *H01L 29/408* (2013.01); *H01L 21/823807* (2013.01); *H01L 21/823821* (2013.01); *H01L 21/823878* (2013.01); *H01L 27/0922* (2013.01); *H01L 29/0653* (2013.01); *H01L 29/1037* (2013.01); *H01L 29/1095* (2013.01);

(Continued)

(58) Field of Classification Search
CPC ............... H01L 29/408; H01L 29/7851; H01L 21/823821; H01L 21/823878; H01L 27/0922; H01L 21/823807; H01L 29/1037; H01L 29/1095; H01L 29/7835; H01L 29/66681; H01L 29/7816; H01L 29/0653; H01L 29/7848; H01L 29/785; H01L 21/823431; H01L 29/165; H01L 29/66545; H01L 29/42376; H01L 29/42368

See application file for complete search history.

(56) References Cited

U.S. PATENT DOCUMENTS

| | | |
|---|---|---|
| 6,025,237 A | 2/2000 | Choi |
| 6,476,457 B2 | 11/2002 | Oh |

(Continued)

FOREIGN PATENT DOCUMENTS

| | | |
|---|---|---|
| KR | 10-2011-0037030 A | 4/2011 |
| KR | 10-2016-0149678 A | 12/2016 |

*Primary Examiner* — Steven H Loke
*Assistant Examiner* — Juanita B Rhodes
(74) *Attorney, Agent, or Firm* — Myers Bigel, P.A.

(57) ABSTRACT

A semiconductor device may include an active fin, an element isolation film on a lower portion of the active fin and a gate structure crossing over the active fin. The gate structure may include first and second sides. The device may also include a source region and a drift region adjacent the first and second sides of the gate structure, respectively. The drift region may have a first impurity concentration. The device may further include a drain region that is in the drift region and may have a second impurity concentration higher than the first impurity concentration, a first trench that is in the drift region and may have a depth less than a height of the active fin, and an upper embedded insulating layer in the first trench. The gate structure may overlap a portion of the drift region and a portion of the first trench.

19 Claims, 30 Drawing Sheets

(51) Int. Cl.
  *H01L 27/092* (2006.01)
  *H01L 21/8238* (2006.01)
(52) U.S. Cl.
  CPC .... *H01L 29/66681* (2013.01); *H01L 29/7816* (2013.01); *H01L 29/7851* (2013.01)

(56) References Cited

U.S. PATENT DOCUMENTS

| | | | |
|---|---|---|---|
| 6,844,593 B2 | 1/2005 | Kikuchi et al. | |
| 7,696,564 B1 | 4/2010 | Liao et al. | |
| 7,968,921 B2 | 6/2011 | Bulucea et al. | |
| 8,017,486 B2 | 9/2011 | Huang et al. | |
| 8,063,445 B2 | 11/2011 | Kato et al. | |
| 8,293,612 B2 | 10/2012 | Lee | |
| 8,476,137 B1 | 7/2013 | LiCausi et al. | |
| 8,878,309 B1* | 11/2014 | Hong | H01L 27/0886 257/401 |
| 9,006,811 B2 | 4/2015 | Meiser et al. | |
| 9,087,719 B2 | 7/2015 | Ahsan et al. | |
| 9,196,728 B2 | 11/2015 | Sridhar | |
| 9,219,146 B2 | 12/2015 | Yoo et al. | |
| 2008/0230852 A1* | 9/2008 | Yu | H01L 21/823431 257/401 |
| 2011/0037030 A1* | 2/2011 | Holzapfel | B82Y 30/00 252/507 |
| 2011/0217817 A1* | 9/2011 | Kim | H01L 21/28 438/238 |
| 2012/0061762 A1 | 3/2012 | Cheng et al. | |
| 2012/0074497 A1 | 3/2012 | Gao | |
| 2012/0223386 A1 | 9/2012 | Cheng et al. | |
| 2012/0286361 A1 | 11/2012 | Huang | |
| 2014/0353763 A1* | 12/2014 | Chung | H01L 21/823431 257/390 |
| 2016/0043217 A1 | 2/2016 | Cai | |
| 2016/0141413 A1* | 5/2016 | Noh | H01L 29/1095 257/337 |
| 2016/0372456 A1 | 12/2016 | Yoo et al. | |

* cited by examiner

SEMICONDUCTOR DEVICES INCLUDING AN ACTIVE FIN AND A DRIFT REGION

CROSS-REFERENCE TO RELATED APPLICATION

This application claims priority under 35 U.S.C. § 119 to Korean Patent Application No. 10-2016-0086964 filed on Jul. 8, 2016 in the Korean Intellectual Property Office, the disclosure of which is incorporated herein by reference in its entirety.

BACKGROUND

The present disclosure generally relates to the field of electronics and, more particularly, to a semiconductor device.

In order to increase integration density of semiconductor devices, multigate transistors including fin-shaped active patterns and three-dimensional channels may be used. Such multigate transistors may be beneficial for scaling-down of semiconductor devices.

Laterally double diffused metal-oxide-semiconductor (LDMOS) transistors having rapid switching response characteristics have been used as high frequency MOS transistors.

SUMMARY

An aspect of the present inventive concept is to provide a semiconductor device for high frequency communications.

According to some embodiments of the present inventive concept, a semiconductor device may include at least one first active fin extending in a first direction on a substrate, an element isolation film on a lower portion of the at least one first active fin and a gate structure extending in a second direction that is different from the first direction and crossing over the at least one first active fin. The gate structure may include first and second sides that are spaced part from each other in the first direction. The device may also include a source region in the at least one first active fin adjacent the first side of the gate structure and a drift region in the at least one first active fin adjacent the second side of the gate structure. The drift region may have a first impurity concentration, and the gate structure may overlap a portion of the drift region in a plan view. The device may further include a drain region that is in the drift region and may have a second impurity concentration that is higher than the first impurity concentration, a first trench that is in the drift region between the gate structure and the drain region and may have a depth less than a height of the at least one first active fin, and an upper embedded insulating layer filling at least a portion of the first trench. The gate structure may overlap a portion of the first trench in the plan view.

According to some embodiments of the present inventive concept, a semiconductor device may include a first element region including a plurality of first active fins extending in a first direction, a shallow trench between first and second ones of the plurality of first active fins, a first element isolation film on sides of the first and second ones of the plurality of first active fins and a second element isolation film in the shallow trench, a capping insulating layer on the second element isolation film, a dummy gate structure on the capping insulating layer, and a first gate structure on the first one of the plurality of first active fins and the first element isolation film. The first and second element isolation films may have different heights. The device may also include a second element region including at least one second active fin extending in the first direction and including a source region and a drain region, a first trench in the at least one second active fin, an upper embedded insulating layer in the first trench, a second gate structure on the at least one second active fin and overlapping a portion of the upper embedded insulating layer in a plan view, and a drift region in the at least one second active fin. The second gate structure may overlap a portion of the drift region in the plan view, the drain region and the upper embedded insulating layer may be in the drift region, and the drift region may have a doping concentration lower than a doping concentration of the drain region.

According to some embodiments of the present inventive concept, a semiconductor device may include an active fin protruding from an upper surface of a substrate and extending in a first direction, a gate structure crossing over the active fin and extending in a second direction that is different from the first direction, and a drift region in the active fin adjacent a side of the gate structure. The drift region may include first impurities having a first conductivity type, and the gate structure may partially overlap the drift region in a plan view. The device may also include an embedded insulating layer in the drift region. The embedded insulating layer may include first and second sides spaced apart from each other in the first direction, the gate structure may partially overlap the embedded insulating layer in the plan view and may overlap the first side of the embedded insulating layer in the plan view, and a lower surface of the embedded insulating layer may be between the upper surface of the substrate and an uppermost surface of the active fin. The device may further include a drain region in the drift region adjacent the second side of the embedded insulating layer. The drain region may include second impurities having the first conductivity type, and a concentration of the second impurities of the drain region may be greater than a concentration of the first impurities of the drift region.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, some embodiments of the present inventive concept will be described with reference to the accompanying drawings.

Figure 1:
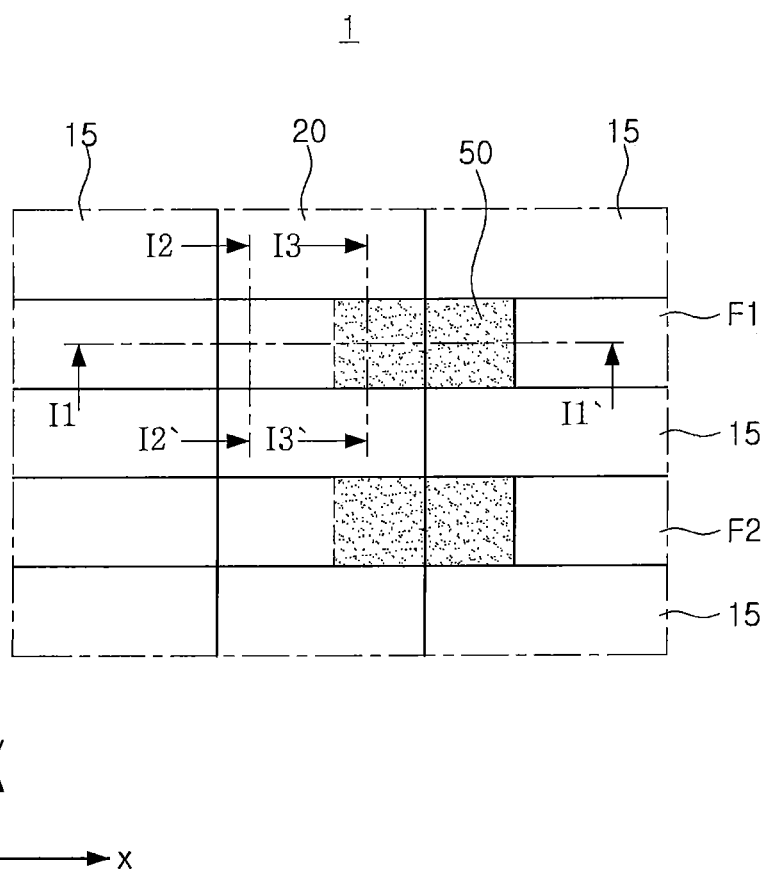
FIGS. 1 and 2 are a layout diagram and a perspective view of a semiconductor device according to an example embodiment of the present inventive concept.
Figure 2:
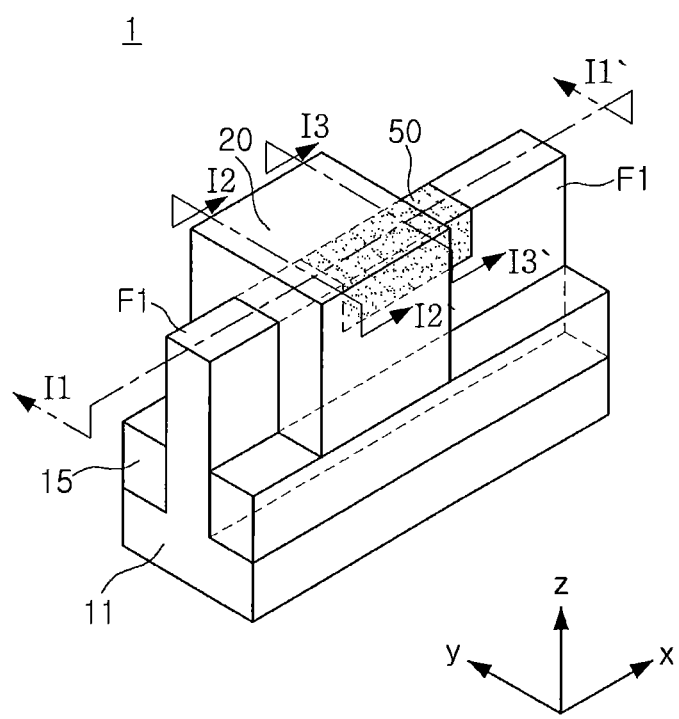
Figure 3A:
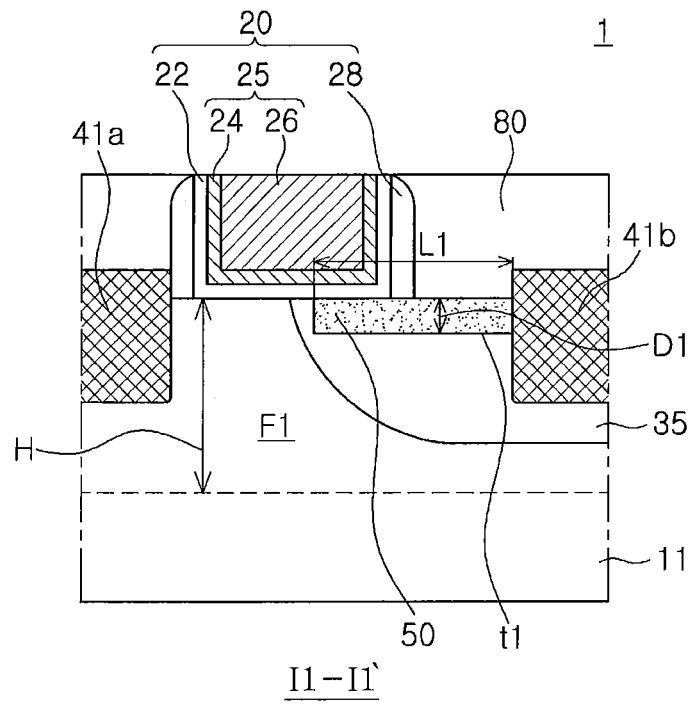
FIGS. 3A to 3C are cross-sectional views of a semiconductor device according to an example embodiment of the present inventive concept.
Figure 3B:
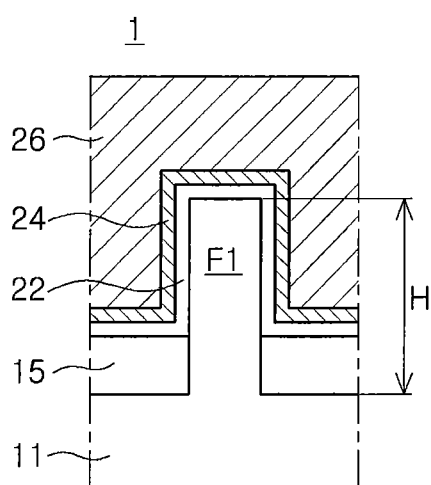
Figure 3C:
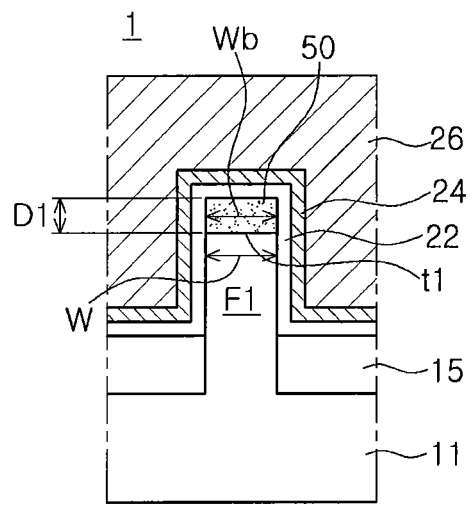

FIGS. 1 and 2 are a layout diagram and a perspective view of a semiconductor device according to an example embodiment of the present inventive concept, while FIGS. 3A to 3C are cross-sectional views of a semiconductor device according to an example embodiment of the present inventive concept. FIGS. 3A to 3C are cross-sectional views taken along the lines I1-I1', I2-I2' and I3-I3' of FIGS. 1 and 2.

With reference to FIGS. 1 to 3C, a semiconductor device 1 according to an example embodiment may include a substrate 11, a first active fin F1, a second active fin F2, a gate structure 20, and an embedded insulating layer 50. The semiconductor device 1 may further include a source region 41a and a drain region 41b disposed on both sides of the gate structure 20. The semiconductor device 1 according to the example embodiment may include a laterally double diffused metal-oxide-semiconductor (LDMOS) transistor having a FinFET structure.

The substrate 11 may be, for example, a bulk silicon or a silicon-on-insulator (SOI). In some embodiments, the substrate 11 may be a group IV-IV compound semiconductor or group III-V compound semiconductor substrate. In some embodiments, the substrate 11 may be a substrate obtained by forming an epitaxial layer on a base substrate.

The first active fin F1 and the second active fin F2 may protrude from the substrate 11 (e.g., upper surface of the substrate). The first active fin F1 and the second active fin F2 may extend lengthwise in a first direction X. Since the first active fin F1 and the second active fin F2 are extended lengthwise in the first direction X, each of the first active fin F1 and the second active fin F2 may include longer sides extended in the first direction X and shorter sides extended in a second direction Y as illustrated in FIG. 2. In some embodiments, corner portions of the first active fin F1 and the second active fin F2 may also be formed to have a rounded shape, differently to the drawing.

Each of the first active fin F1 and the second active fin F2 may be an active pattern used for a multigate transistor. The first active fin F1 and the second active fin F2 may be formed in such a manner that channels are connected to each other along three surfaces of the active fin and may also be formed in such a manner that channels are formed on two surfaces of the active fin, opposing each other.

The first active fin F1 and the second active fin F2 may be portions of the substrate 11 and may also include an epitaxial layer grown from the substrate 11.

The first active fin F1 and the second active fin F2 may include, for example, silicon (Si) or germanium (Ge), an elemental semiconductor material. In addition, the first active fin F1 and the second active fin F2 may include a compound semiconductor, and for example, may include a group IV-IV compound semiconductor or a group III-V compound semiconductor. In detail, for example, in the case of the group IV-IV compound semiconductor, the first active fin F1 and the second active fin F2 may include a compound semiconductor including at least two of carbon (C), silicon (Si), germanium (Ge), and tin (Sn). For example, in the case of the group III-V compound semiconductor, the first active fin F1 and the second active fin F2 may include a compound semiconductor including, as a group III element, at least one of aluminum (Al), gallium (Ga), and indium (In), and, as a group V element, at least one of phosphorus (P), arsenic (As) and stibium (Sb).

The first active fin F1 and the second active fin F2 may be doped with a first conductivity-type impurity. For example, in the case of an n-type metal oxide semiconductor (NMOS) transistor, the first active fin F1 and the second active fin F2 may be doped with a p-type impurity, and in the case of a PMOS transistor, the first active fin F1 and the second active fin F2 may be doped with an n-type impurity.

An element isolation film 15 may be formed on the substrate 11 and may be disposed in the vicinity of the first active fin F1 and the second active fin F2. The element isolation film 15 may be formed to cover lower portions of the first active fin F1 and the second active fin F2. For example, a level of an upper surface of the element isolation film 15 may be lower than levels of upper surfaces of the first active fin F1 and the second active fin F2. The first active fin F1 and the second active fin F2 may be defined by the element isolation film 15. The element isolation film 15 may have a shallow trench isolation (STI) structure, but is not limited thereto.

The element isolation film 15 may include at least one of, for example, silicon oxide, silicon nitride, silicon oxynitride, and combinations thereof.

The gate structure 20 may be formed to extend in a second direction Y to intersect the first active fin F1 and the second active fin F2. The gate structure 20 may be disposed to surround upper portions of the first active fin F1 and the second active fin F2. The gate structure 20 may be disposed to surround a portion of an embedded insulating layer 50. The gate structure 20 may also be disposed on the element isolation film 15. The gate structure 20 is illustrated as being continuously disposed on the first active fin F1 and the second active fin F2, but is not limited thereto. In some embodiments, the gate structure 20 may be disposed separately on the first active fin F1 and the second active fin F2. For example, the gate structure 20 may be separately disposed on respective active fins. In some embodiments, the gate structure 20 may also be continuously disposed on three or more active fins.

The gate structure 20 may include a gate insulating layer 22, a gate electrode 25, and a spacer 28.

The gate insulating layer 22 may be disposed between the first and second active fins F1 and F2 and the gate electrode 25 and may be disposed between the gate electrode 25 and the spacer 28. The gate insulating layer 22 may include a high-k insulating layer. The high-k insulating layer may include a high-k material having a dielectric constant higher than that of a silicon oxide film. The high-k insulating layer may include, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but is not limited thereto.

Between the gate insulating layer 22 and the first and second active fins F1 and F2, an interface layer (not shown) may be further disposed to reduce or possibly prevent the occurrence of a defective interface between a gate insulating layer 22 and the substrate 11. The interface layer may include, for example, a silicon oxide layer, a silicon oxynitride layer, or a layer of a combination thereof.

The gate electrode 25 may include a first metal layer 24 and a second metal layer 26. The first metal layer 24 may serve to perform a work control function, and the second metal layer 26 may serve to fill a space formed by the first metal layer 24. For example, the first metal layer 24 may include at least one of TiN, WN, TiAl, TiAlN, TaN, TiC, TaC, TaCN, TaSiN, or combinations thereof, but is not limited thereto. In addition, the second metal layer 26 may include, for example, at least one of tungsten (W), aluminum (Al), copper (Cu), cobalt (Co), titanium (Ti), tantalum (Ta), poly-Si, or metal alloys, but is not limited thereto. The gate electrode 25 may be formed using a gate replacement process or a gate last process, but is not limited thereto.

The embedded insulating layer 50 may be disposed in the first active fin F1 and the second active fin F2. The embedded insulating layer 50 may be disposed to partially overlap the gate structure 20. In some embodiments, the gate structure 20 may partially overlap the embedded insulating layer 50 in a plan view as illustrated in FIGS. 2 and 3A.

In portions of the first and second active fins F1 and F2, a first trench t1 may be disposed to partially overlap the gate structure 20. In some embodiments, the gate structure 20 may partially overlap the first trench t1 in a plan view as illustrated in FIGS. 2 and 3A. The first trench t1 may be formed by removing portions of the first and second active fins F1 and F2, and a depth D1 of the first trench t1 may be less than a height H of each of the first and second active fins F1 and F2. The first trench t1 may have a length L1 in the first direction X.

The embedded insulating layer 50 may fill the first trench t1. An upper surface of the embedded insulating layer 50 may be located on the same level as upper surfaces of the first and second active fins F1 and F2. In some embodiments, the upper surface of the embedded insulating layer 50 may be coplanar with the upper surfaces of the first and second active fins F1 and F2. For example, a thickness of the embedded insulating layer 50 may be identical to (e.g., substantially equal to) the depth D1 of the first trench t1, but is not limited thereto. Thus, a thickness of the embedded insulating layer 50 may be less than the depth D1 of the first trench t1. In some embodiments, a thickness of the embedded insulating layer 50 may be greater than the depth D1 of the first trench t1.

A width Wb of the embedded insulating layer 50 in the second direction Y may be substantially the same as a width W of each of the first and second active fins F1 and F2 in the second direction Y, but is not limited thereto. In some example embodiments, the width Wb of the embedded insulating layer 50 in the second direction Y may be less than the width W of the first and second active fins F1 and F2 in the second direction Y. In some example embodiments, the width Wb of the embedded insulating layer 50 in the second direction Y may be greater than the width W of the first and second active fins F1 and F2 in the second direction Y.

A length of the embedded insulating layer 50 in the first direction X may be identical to (e.g., substantially equal to) the length L1 of the first trench t1 in the first direction X.

By controlling the length of the embedded insulating layer 50 in the first direction X, an operating voltage and a breakdown voltage of the semiconductor device 1 may be controlled. For example, as the length of the embedded insulating layer 50 in the first direction X increases, an operating voltage of the semiconductor device 1 may be increased, and a breakdown voltage of the semiconductor device 1 may also be increased. In the case of the semiconductor device 1 having the embedded insulating layer 50 as described above, the size of a device may be reduced as compared to a semiconductor device having a deep trench isolation (DTI) structure overlapping a gate structure.

The source region 41a may be disposed in the first and second active fins F1 and F2 on one side of the gate structure 20, and the drain region 41b may be disposed in the first and second active fins F1 and F2 on the other side of the gate structure 20 and disposed on one side of the embedded insulating layer 50. The drain region 41b may not overlap the gate structure 20 by the embedded insulating layer 50. In some embodiments, the gate structure 20 may not overlap the drain region 41b in a plan view as illustrated in FIGS. 2 and 3A. Thus, for example, when a high voltage is applied to the drain region 41b, the semiconductor device 1 may be possibly prevented from being degraded, by a relatively high electric field formed between the drain region 41b and an edge of the gate electrode 25.

The source region 41a and the drain region 41b may be epitaxial layers formed using an epitaxial growth method. In detail, the source region 41a and the drain region 41b may include silicon or germanium, an elemental semiconductor material. In addition, the source region 41a and the drain region 41b may include a compound semiconductor, and for example, may include a group IV-IV compound semiconductor or a group III-V compound semiconductor, but are not limited thereto. The source region 41a and the drain region 41b are not limited to the illustration of the drawings, and may have portions extended to a lower portion of the spacer 28. The source region 41a and the drain region 41b may include a second conductivity-type impurity having a relatively high concentration and may be formed by a process of ion implantation into the active fins F1 and F2. For example, when the first conductivity-type impurity doped on the active fins is a p-type impurity, the source region 41a and the drain region 41b may be doped with an n-type impurity.

Depths of the source region 41a and the drain region 41b may be greater than that of the embedded insulating layer 50, in such a manner that lower surfaces of the source region 41a and the drain region 41b may be lower than a lower surface of the embedded insulating layer 50. For example, the depths of the source region 41a and the drain region 41b may be greater than the depth D1 of the first trench t1. In some example embodiments, depths of the source region 41a and the drain region 41b may be less than the depth D1 of the first trench t1.

The semiconductor device 1 may further include a drift region 35 extended to a lower portion of the gate structure 20 while surrounding the drain region 41b and the embedded insulating layer 50. The drain region 41b and the embedded insulating layer 50 may be disposed in the drift region 35.

The drift region 35 may be doped with the same second conductivity-type impurity as the source and drain regions 41a and 41b, using an ion implantation process. The drift region 35 may be doped at a lower concentration than that of the drain region 41b. The drift region 35 is illustrated as having a depth lower than a height H of each of the first and second active fins F1 and F2, but is not limited thereto. In some example embodiments, a depth of the drift region 35 may be greater than the height H of the first and second active fins F1 and F2.

By controlling a doping concentration of the drift region 35 together with controlling a length of the embedded insulating layer 50 in the first direction X, an operating voltage and a breakdown voltage of the semiconductor device 1 may be controlled.

The spacer 28 may be disposed on a sidewall of the gate electrode 25 extended in the second direction Y. For example, the spacer 28 may include at least one of SiN, SiON, SiO$_2$, SiOCN, and combinations thereof. The spacer 28 may include a first spacer disposed on one side of the gate electrode 25 and a second spacer disposed on the other side of the gate electrode 25. The first spacer may be in contact with the source region 41a and the second spacer may be in contact with the embedded insulating layer 50. For example, the first spacer may be disposed on the source region 41a, and the second spacer may be disposed on the embedded insulating layer 50.

An interlayer insulating layer 80 may be formed on the source region 41a and the drain region 41b. The interlayer insulating layer 80 may be formed on a portion of the embedded insulating layer 50. In addition, the interlayer insulating layer 80 may be formed to surround the gate structure 20.

The interlayer insulating layer 80 may include, for example, at least one of silicon oxide, silicon nitride, silicon oxynitride, and a low dielectric constant material. An example of the low dielectric constant material may include, for example, Flowable Oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK™, polyimide, a porous polymeric material, or a combination thereof, but is not limited thereto.

Figure 4:
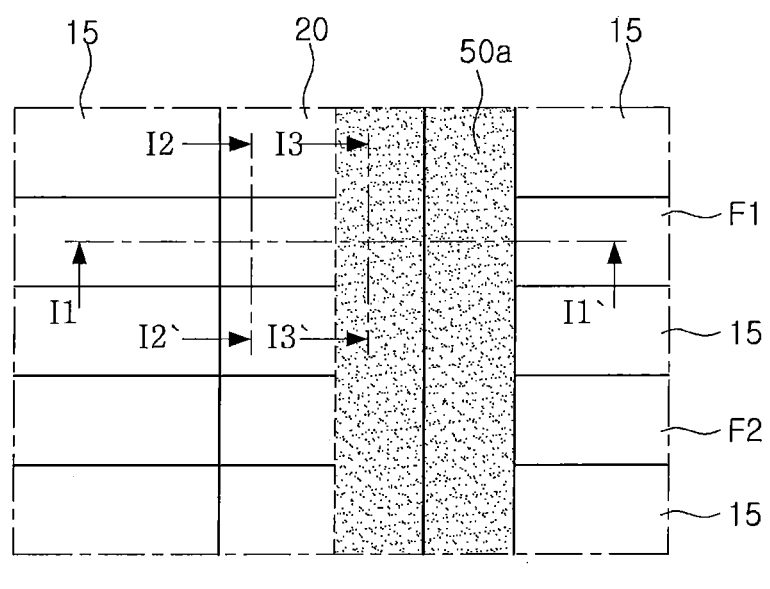
FIGS. 4 and 5 are a layout diagram and a perspective view of a semiconductor device according to an example embodiment of the present inventive concept.
Figure 5:
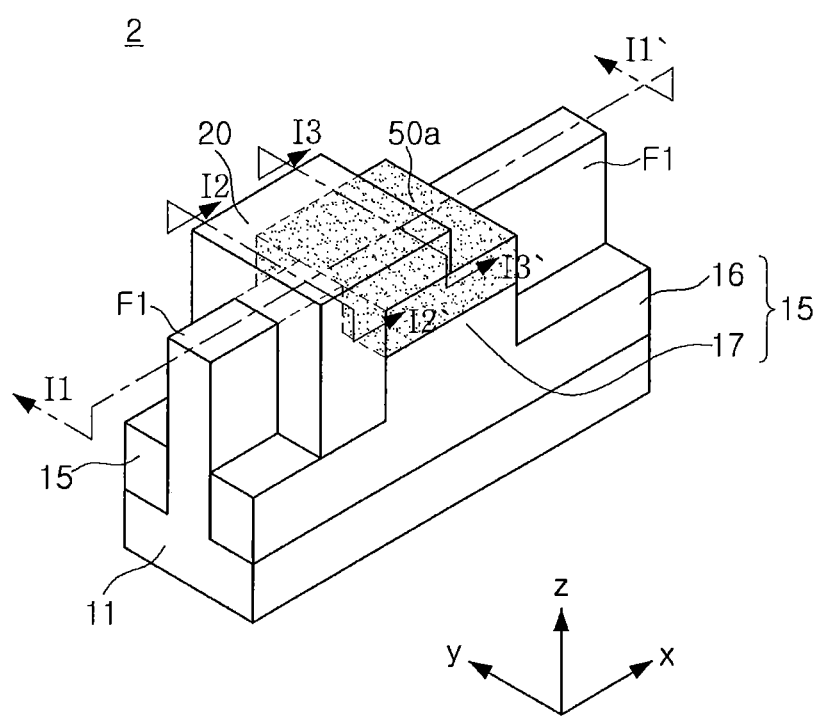
Figure 6A:
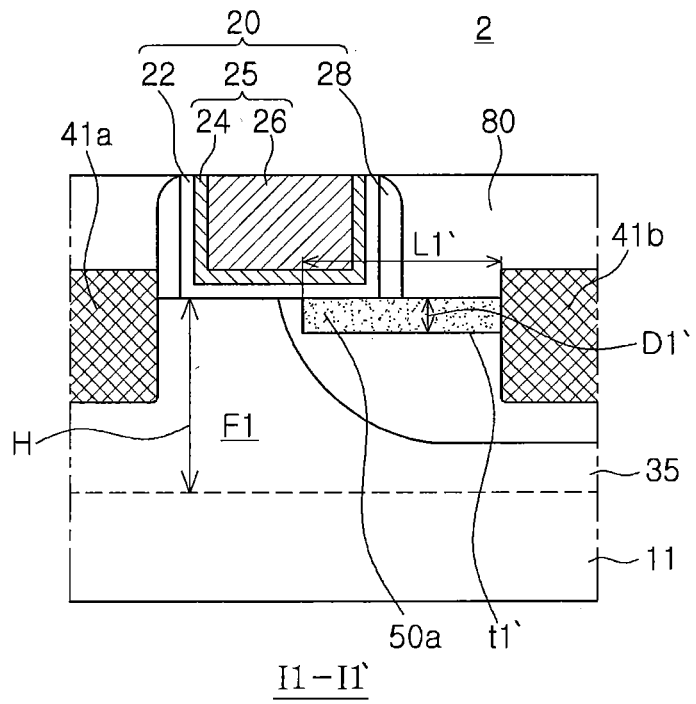
FIGS. 6A to 6C are cross-sectional views illustrating a semiconductor device according to an example embodiment of the present inventive concept.
Figures 6B, 6C:
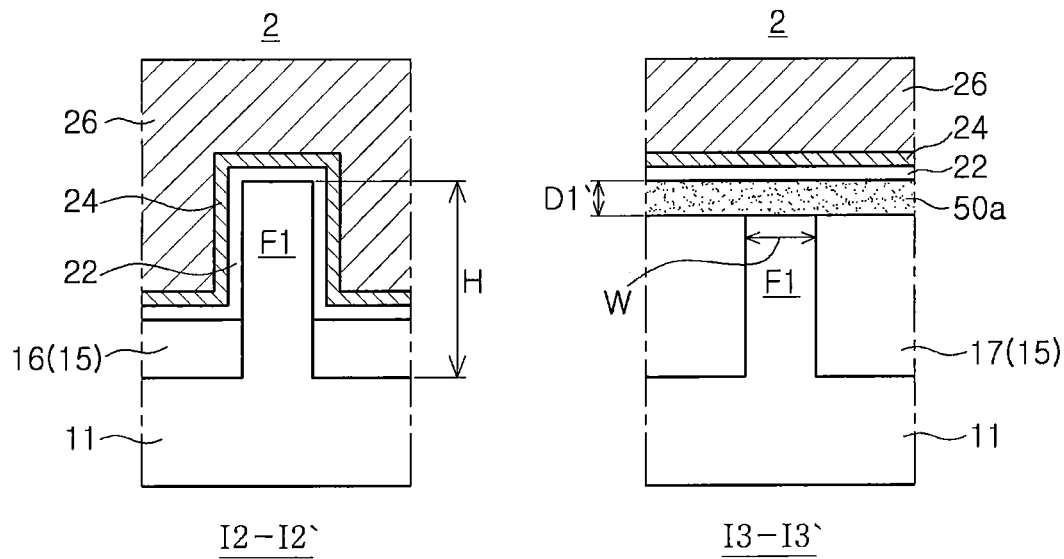

FIGS. 4 and 5 are a layout diagram and a perspective view of a semiconductor device 2 according to an example embodiment. FIGS. 6A to 6C are cross-sectional views illustrating a semiconductor device 2 according to an example embodiment. FIGS. 6A to 6C are cross-sectional views taken along the lines I1-I1', I2-I2' and I3-I3' of FIGS. 4 and 5. The semiconductor device 2 of FIGS. 4 to 6C is a modified example of the semiconductor device 1 of FIGS. 1 to 3C. For convenience of explanation, descriptions thereof different from the descriptions of FIGS. 1 to 3C will be principally provided.

With reference to FIGS. 4 to 6C, the semiconductor device 2 according to an example embodiment may include a substrate 11, a first active fin F1, a second active fin F2, a gate structure 20, and an embedded insulating layer 50a. The semiconductor device 2 may further include a source region 41a disposed on one side of the gate structure 20, and a drain region 41b disposed on the other side of the gate structure 20 and disposed on one side of the embedded insulating layer 50a.

The first active fin F1 and the second active fin F2 may protrude from the substrate 11. The first active fin F1 and the second active fin F2 may extend lengthwise in a first direction X.

An element isolation film 15 may be formed on the substrate 11 and may be disposed in the vicinity of the first active fin F1 and the second active fin F2. The element isolation film 15 may be formed to cover portions of the first active fin F1 and the second active fin F2. For example, a level of an upper surface of the element isolation film 15 may be lower than levels of upper surfaces of the first active fin F1 and the second active fin F2. The element isolation film 15 may include a first portion 16 and a second portion 17 having different heights. A height of the second portion 17 may be higher than that of the first portion 16 as illustrated in FIGS. 5, 6B and 6C. The second portion 17 may be disposed below the embedded insulating layer 50a.

The gate structure 20 may be formed to extend in a second direction Y to intersect the first active fin F1 and the second active fin F2. The gate structure 20 may be disposed to surround upper portions of the first active fin F1 and the second active fin F2. The gate structure 20 may be disposed on the embedded insulating layer 50a to partially overlap therewith. In some embodiments, the gate structure 20 may partially overlap the embedded insulating layer 50a in a plan view as illustrated in FIGS. 5 and 6A. A portion of the gate structure 20 not overlapping the embedded insulating layer 50a may also be disposed on the element isolation film 15. The gate structure 20 is illustrated as being continuously disposed on the first active fin F1 and the second active fin F2, but is not limited thereto.

The embedded insulating layer 50a may extend in the second direction Y to intersect the first active fin F1 and the second active fin F2. The embedded insulating layer 50a may be disposed below the gate structure 20 and may partially overlap therewith.

In portions of the first and second active fins F1 and F2, a first trench t1' disposed to partially overlap the gate structure 20 may be disposed. In some embodiments, the gate structure 20 may partially overlap the first trench t1' in a plan view as illustrated in FIGS. 5 and 6A. The first trench t1' may be formed by removing portions of the first and second active fins F1 and F2, and a depth D1' of the first trench t1' may be less than a height H of each of the first and second active fins F1 and F2. The first trench t1' may have a length L1' in the first direction X.

The embedded insulating layer 50a may fill the first trench t1' and extend in the second direction Y. An upper surface of the embedded insulating layer 50a may be located on the same level as an upper surface of the first active fin F1. In some embodiments, the upper surface of the embedded insulating layer 50a may be coplanar with the upper surface of the first active fin F1. A thickness of the embedded insulating layer 50a may be identical to (e.g., substantially equal to) the depth D1' of the first trench t1'. A length of the embedded insulating layer 50a in the first direction X may be identical to (e.g., substantially equal to) the length L1' of the first trench t1' in the first direction X.

By adjusting the length of the embedded insulating layer 50a in the first direction X, an operating voltage and a breakdown voltage of the semiconductor device 2 may be controlled. For example, as the length of the embedded insulating layer 50a in the first direction X increases, an operating voltage of the semiconductor device 2 may be increased and a breakdown voltage of the semiconductor device 2 may also be increased.

Figure 7:
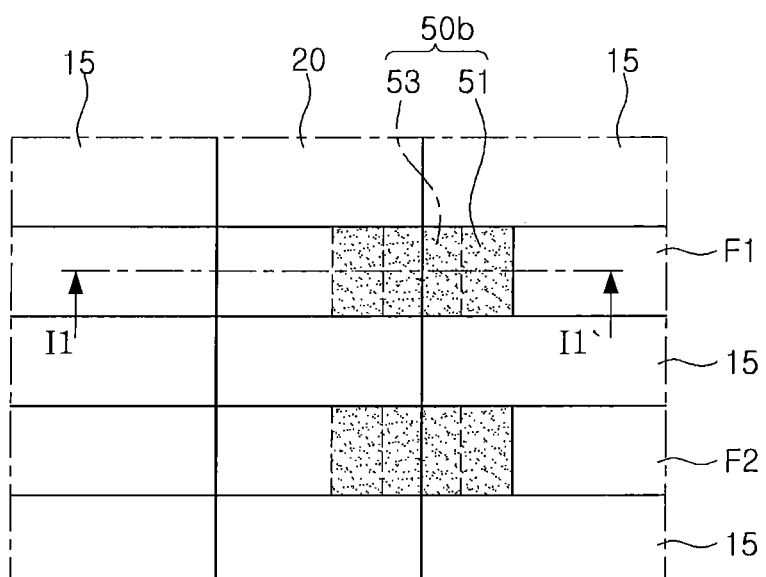
FIGS. 7 and 8 are a layout diagram and a perspective view of a semiconductor device according to an example embodiment of the present inventive concept.
Figure 8:
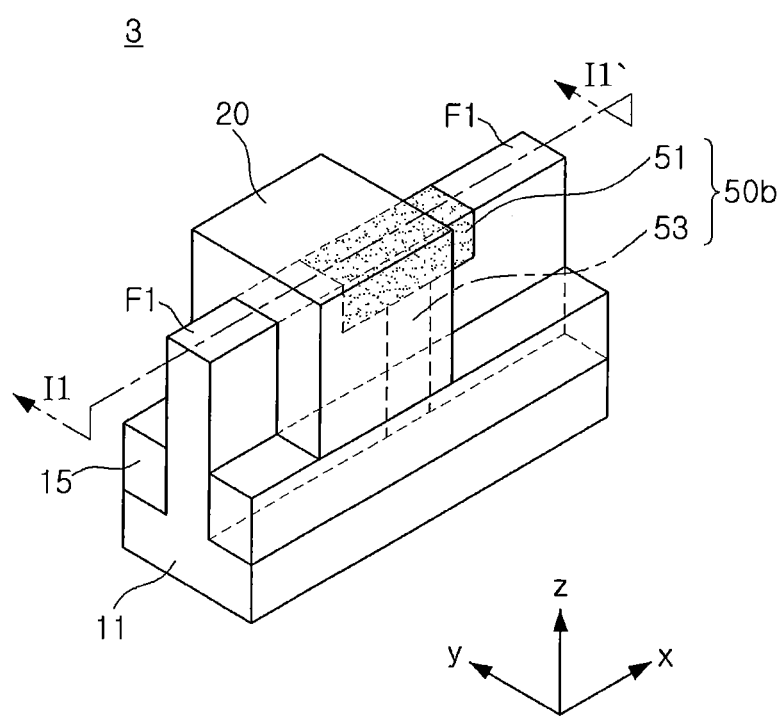
Figure 9:
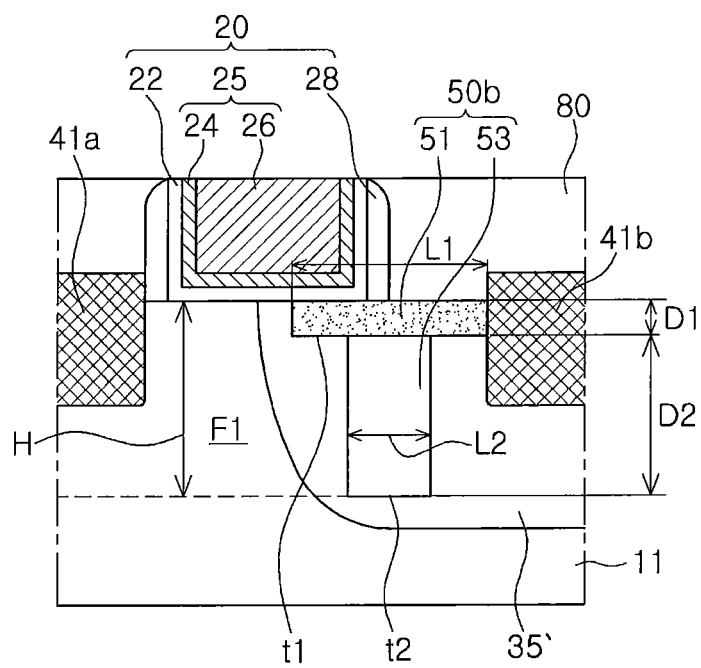
FIG. 9 is a cross-sectional view of a semiconductor device according to an example embodiment of the present inventive concept.

FIGS. 7 and 8 are a layout diagram and a perspective view of a semiconductor device according to an example embodiment. FIG. 9 is a cross-sectional view of a semiconductor device according to an example embodiment. FIG. 9 is a cross-sectional view taken along the line I1-I1' of FIGS. 7 and 8. A semiconductor device 3 of FIGS. 7 to 9 is a modified example of the semiconductor device 1 of FIGS. 1 to 3C. For convenience of explanation, descriptions thereof different from the descriptions of FIGS. 1 to 3C will be principally provided.

With reference to FIGS. 7 to 9, the semiconductor device 3 according to an example embodiment may include a substrate 11, a first active fin F1, a second active fin F2, a gate structure 20, and an embedded insulating layer 50*b*. The embedded insulating layer 50*b* may include an upper embedded insulating layer 51 and a lower embedded insulating layer 53. The semiconductor device 3 may further include a source region 41*a* disposed on one side of the gate structure 20, and a drain region 41*b* disposed on the other side of the gate structure 20 and disposed on one side of the embedded insulating layer 50*b*.

An element isolation film 15 may be formed on the substrate 11 and may be disposed in the vicinity of the first active fin F1 and the second active fin F2. The element isolation film 15 may be formed to cover lower portions of the first active fin F1 and the second active fin F2. The element isolation film 15 may be disposed to surround a lower portion of the embedded insulating layer 50*b*. In detail, the element isolation film 15 may be disposed to surround a lower portion of the lower embedded insulating layer 53. The lower embedded insulating layer 53 may be formed of the same material as a material formed in the same process as that of the element isolation film 15. In some embodiments, the lower embedded insulating layer 53 and the element isolation film 15 may be formed simultaneously by the same process and may include the same material. It will be understood that "formed simultaneously" refers to formation in a same fabrication step, at approximately (but not necessarily exactly) the same time. A level of an upper surface of the element isolation film 15 may be lower than levels of upper surfaces of the first active fin F1 and the second active fin F2 and an upper surface of the embedded insulating layer 50*b*.

The gate structure 20 may extend in a second direction Y to intersect the first active fin F1 and the second active fin F2. The gate structure 20 may be disposed to surround upper portions of the first active fin F1 and the second active fin F2. The gate structure 20 may be disposed on the embedded insulating layer 50*b* to partially overlap therewith. In some embodiments, the gate structure 20 may partially overlap the embedded insulating layer 50*b* in a plan view as illustrated in FIGS. 8 and 9. The gate structure 20 may also be disposed on the element isolation film 15. The gate structure 20 is illustrated as being continuously disposed on the first active fin F1 and the second active fin F2, but is not limited thereto. The gate structure 20 may be respectively disposed on the first active fin F1 and the second active fin F2.

The embedded insulating layer 50*b* may be disposed within the first active fin F1 and the second active fin F2. The embedded insulating layer 50*b* may include the upper embedded insulating layer 51 and the lower embedded insulating layer 53 disposed below the upper embedded insulating layer 51. The embedded insulating layer 50*b* may be disposed below the gate structure 20 and may partially overlap the gate structure 20. In detail, the upper embedded insulating layer 51 may partially overlap the gate structure 20. In an example embodiment, the lower embedded insulating layer 53 may not overlap the gate structure 20.

The semiconductor device 3 may include a first trench t1 disposed to partially overlap the gate structure 20 in portions of the first and second active fins F1 and F2. The semiconductor device 3 may include a second trench t2 disposed below the first trench t1. The first and second trenches t1 and t2 may be regions formed by removing portions of the first and second active fins F1 and F2. A depth D1 of the first trench t1 may be less than a height H of each of the first and second active fins F1 and F2. A sum of the depth D1 of the first trench t1 and a depth D2 of the second trench t2 may be identical to the height H of each of the first and second active fins F1 and F2. In this case, the depth D1 of the first trench t1 and the depth D2 of the second trench t2 may be provided by values based on an upper surface of the active fin, and the depth D2 of the second trench t2 may be provided by a value based on a lower surface of the first trench t1. The first trench t1 may have a first length L1 in the first direction X. The second trench t2 may have a second length L2 in the first direction X, The first length L1 of the first trench t1 may be greater than a second length L2 of the second trench t2 in the first direction X. A side surface of the second trench t2 is illustrated as having a vertical form, but is not limited thereto. Thus, the side surface of the second trench t2 may have an inclined shape. For example, the second trench t2 may have a form in which the second length L2 is reduced toward a lower portion thereof.

The embedded insulating layer 50*b* may fill the first trench t1 and the second trench t2. An upper surface of the embedded insulating layer 50*b* may be located on the same level as upper surfaces of the first and second active fins F1 and F2. For example, a thickness of the upper embedded insulating layer 51 may be identical to the depth D1 of the first trench t1. A thickness of the lower embedded insulating layer 53 may be identical to (e.g., substantially equal to) the depth D2 of the second trench t2. A thickness of the embedded insulating layer 50*b* may correspond to a value obtained by summing a thickness of the upper embedded insulation layer 51 and a thickness of the lower embedded insulating layer, and may be identical to (e.g., substantially equal to) a height of each of the first and second active fins F1 and F2. The thickness of the embedded insulating layer 50*b* is not limited to the illumination of the drawing, and thus, a thickness of the upper embedded insulating layer 51 may be different from the depth D1 of the first trench t1.

Figure 13:
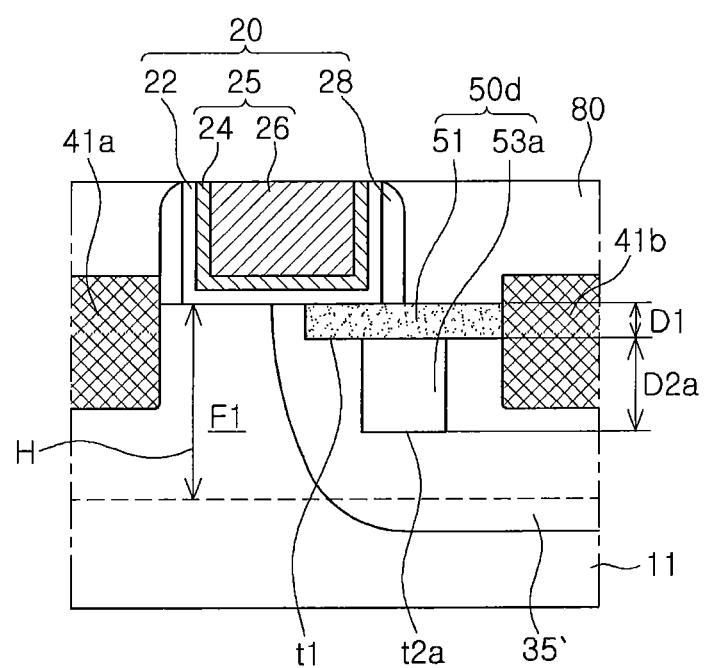
FIGS. 13 and 14 are cross-sectional views of semiconductor devices according to example embodiments of the present inventive concept.

In an example embodiment, in a manner similar to a semiconductor device 5 illustrated in FIG. 13, a thickness of an embedded insulating layer 50*d* may be less than the height H of the first and second active fins F1 and F2. For example, a sum of a depth D1 of a first trench t1 and a depth D2*a* of a second trench t2*a* may be less than a height H of each of first and second active fins F1 and F2. A thickness of a lower embedded insulating layer 53*a* of FIG. 13 may be less than a thickness of the lower embedded insulating layer 53 of FIG. 9. For example, the depth D2*a* of the second trench t2*a* may be less than the depth D2 of the second trench t2 of FIG. 9.

In a different manner, in an example embodiment, a thickness of the embedded insulating layer 50*b* may be greater than the height H of the first and second active fins F1 and F2.

By adjusting a depth of the second trench t2, for example, adjusting a thickness of the embedded insulating layer 50*b*, an operating voltage and a breakdown voltage of the semiconductor device may be controlled.

A length of the upper embedded insulating layer 51 in the first direction X may be identical to (e.g., substantially equal to) the length L1 of the first trench t1 in the first direction X. A length of the lower embedded insulating layer 53 in the first direction X may be identical to (e.g., substantially equal to) the length L2 of the second trench t2 in the first direction X. For example, a length of the lower embedded insulating layer 53 in the first direction may be shorter than that of the upper embedded insulating layer 51 in the first direction.

A width of the embedded insulating layer 50b in the second direction Y may be substantially identical to (e.g., substantially equal to) a width of each of the first and second active fins F1 and F2 in the second direction Y. In an example embodiment, a width of the embedded insulating layer 50b in the second direction Y may be different from a width of each of the first and second active fins F1 and F2 in the second direction Y.

The upper embedded insulating layer 51 may be in contact with the drain region 41b and the lower embedded insulating layer 53 may not be in contact with the drain region 41b.

The semiconductor device 3 may further include a drift region 35' extended to a lower portion of the gate structure 20, while surrounding the drain region 41b and the embedded insulating layer 50b, and doped at a lower concentration than that of the drain region 41b. The drain region 41b and the embedded insulating layer 50b may be disposed in the drift region 35'. In order to surround the lower embedded insulating layer 53, a depth of the drift region 35' may be greater than the height H of the first and second active fins F1 and F2.

Figure 10:
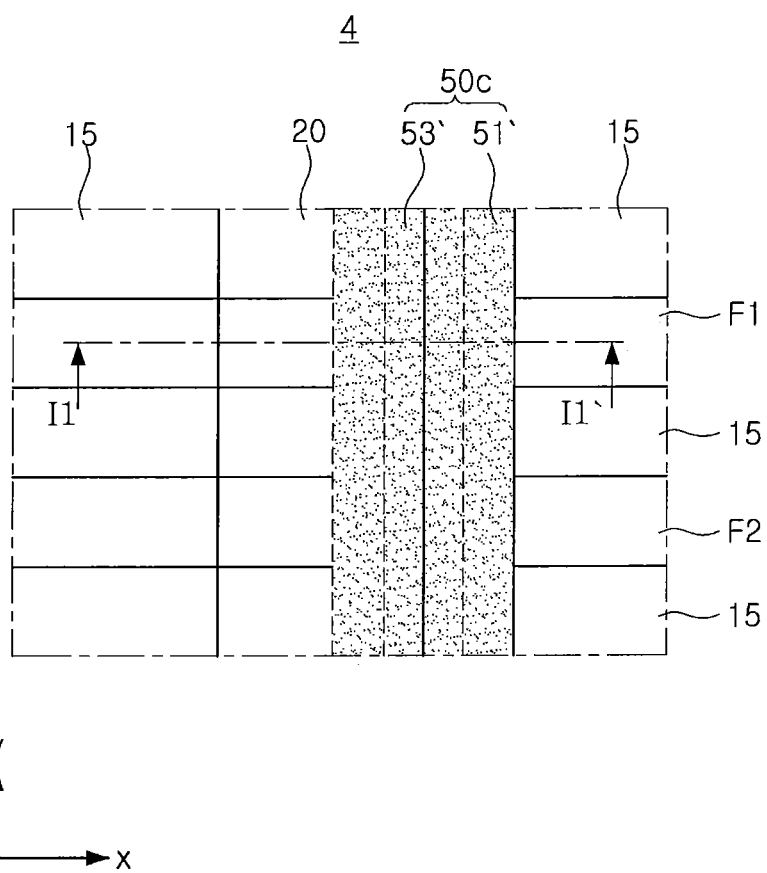
FIGS. 10 and 11 are a layout diagram and a perspective view of a semiconductor device according to an example embodiment of the present inventive concept.
Figure 11:
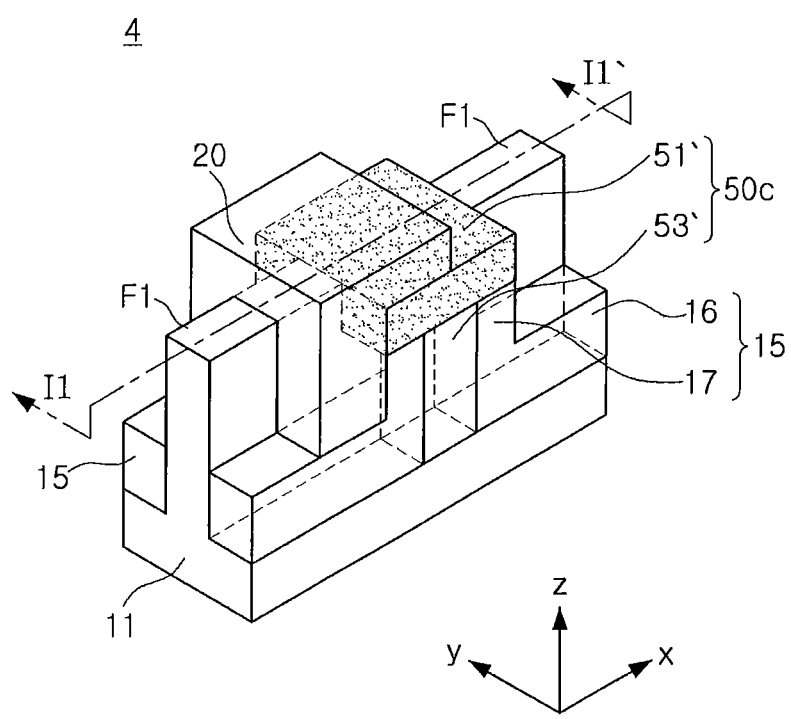
Figure 12:
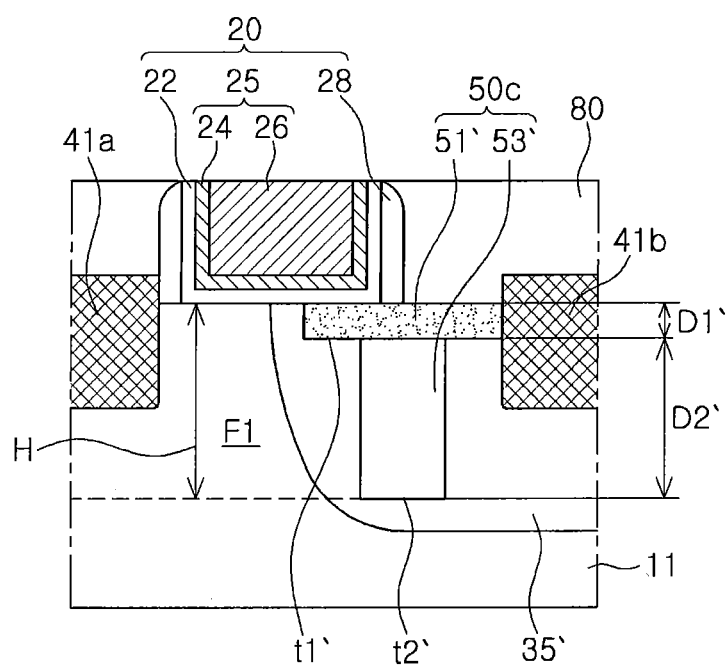
FIG. 12 is a cross-sectional view of a semiconductor device according to an example embodiment of the present inventive concept.

FIGS. 10 and 11 are a layout diagram and a perspective view of a semiconductor device 4 according to an example embodiment. FIG. 12 is a cross-sectional view of the semiconductor device 4 according to an example embodiment. FIG. 12 is a cross-sectional view taken along the line I1-I1' of FIGS. 10 and 11. The semiconductor device 4 of FIGS. 10 to 12 is a modified example of the semiconductor device 3 of FIGS. 7 to 9. For convenience of explanation, descriptions thereof different from the descriptions of FIGS. 7 to 9 will be principally provided.

With reference to FIGS. 10 to 12, the semiconductor device 4 according to an example embodiment may include a substrate 11, a first active fin F1, a second active fin F2, a gate structure 20, and an embedded insulating layer 50c. The embedded insulating layer 50c may include an upper embedded insulating layer 51' and a lower embedded insulating layer 53'. The semiconductor device 4 may further include a source region 41a disposed on one side of the gate structure 20, and a drain region 41b disposed on the other side of the gate structure 20 and disposed on one side of the embedded insulating layer 50c.

An element isolation film 15 may be formed on the substrate 11 and may be disposed in the vicinity of the first active fin F1 and the second active fin F2. The element isolation film 15 may be formed to surround lower portions of the first active fin F1 and the second active fin F2. A level of an upper surface of the element isolation film 15 may be lower than levels of upper surfaces of the first active fin F1 and the second active fin F2. The element isolation film 15 may include a first portion 16 and a second portion 17 having different heights. A height of the second portion 17 may be higher than that of the first portion 16. The second portion 17 may be disposed below the upper embedded insulating layer 51' while surrounding the lower embedded insulating layer 53'. The lower embedded insulating layer 53' may be formed of the same material as a material formed in the same process as that of the element isolation film 15. In some embodiments, the lower embedded insulating layer 53' and the element isolation film 15 may be formed simultaneously by the same process and may include the same material.

The gate structure 20 may extend in a second direction Y to intersect the first active fin F1 and the second active fin F2. The gate structure 20 may be disposed to surround upper portions of the first active fin F1 and the second active fin F2. The gate structure 20 may be disposed on the embedded insulating layer 50c to partially overlap therewith. In some embodiments, the gate structure 20 may partially overlap the embedded insulating layer 50c in a plan view as illustrated in FIGS. 11 and 12. A portion of the gate structure 20 not overlapping the embedded insulating layer 50c may also be disposed on the element isolation film 15. The gate structure 20 is illustrated as being continuously disposed on the first active fin F1 and the second active fin F2, but is not limited thereto.

The embedded insulating layer 50c may extend in the second direction Y to intersect the first active fin F1 and the second active fin F2. The embedded insulating layer 50c may have a portion disposed in the first active fin F1 and the second active fin F2. The embedded insulating layer 50c may include the upper embedded insulating layer 51' and the lower embedded insulating layer 53' disposed below the upper embedded insulating layer 51'. The embedded insulating layer 50c may be disposed below the gate structure 20 and may partially overlap the gate structure 20. In detail, the upper embedded insulating layer 51' may partially overlap the gate structure 20. In an example embodiment, the lower embedded insulating layer 53' may not overlap the gate structure 20.

The semiconductor device 4 may include a first trench t1' disposed to partially overlap the gate structure 20, in portions of the first and second active fins F1 and F2. The semiconductor device 4 may include a second trench t2' disposed below the first trench t1'. The first and second trenches t1' and t2' may be regions formed by removing portions of the first and second active fins F1 and F2. A depth D1' of the first trench t1' may be less than a height H of each of the first and second active fins F1 and F2. A sum of the depth D1' of the first trench t1' and a depth D2' of the second trench t2' may be identical to (e.g., substantially equal to) the height H of the first and second active fins F1 and F2. In an example embodiment, a sum of the depth D1' of the first trench t1' and the depth D2' of the second trench t2' may be less than the height H of each of the first and second active fins F1 and F2. A length of the first trench t1' in the first direction X may be greater than a length of the second trench t2' in the first direction X.

The embedded insulating layer 50c may fill the first trench t1' and the second trench t2'. An upper surface of the embedded insulating layer 50c may be located on the same level as upper surfaces of the first and second active fins F1 and F2. The upper surface of the embedded insulating layer 50c may be coplanar with the upper surfaces of the first and second active fins F1 and F2. A thickness of the upper embedded insulating layer 51' may be identical to (e.g., substantially equal to) the depth D1' of the first trench t1'. A thickness of the lower embedded insulating layer 53' may be identical to (e.g., substantially equal to) the depth D2' of the second trench t2'. A thickness of the embedded insulating layer 50c may correspond to a sum of a thickness of the upper embedded insulation layer 51' and a thickness of the lower embedded insulating layer 53', and may be identical to (e.g., substantially equal to) a height of each of the first and second active fins F1 and F2. The thickness of the embedded insulating layer 50c is not limited to the illustration of the drawing, and thus, a thickness of the upper embedded insulating layer 51' may be different from the depth D1' of the first trench t1'.

The upper embedded insulating layer 51' may be in contact with the drain region 41b and the lower embedded insulating layer 53' may not be in contact with the drain region 41b.

The semiconductor device 4 may further include a drift region 35' that may be extended to a lower portion of the gate structure 20, while surrounding the drain region 41b and the embedded insulating layer 50c, and may be doped at a lower concentration than that of the drain region 41b. In order to surround the lower embedded insulating layer 53, a depth of the drift region 35' may be greater than the height H of the first and second active fins F1 and F2.

Figure 14:
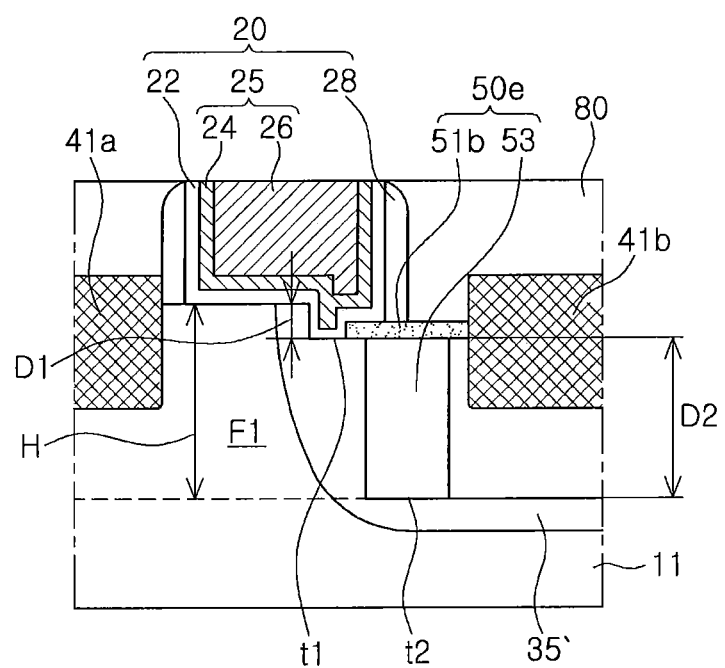

FIG. 14 is a cross-sectional view of a semiconductor device according to an example embodiment.

A semiconductor device 6 of FIG. 14 is a modified example of the semiconductor device 3 of FIG. 9 or the semiconductor device 4 of FIG. 12. For convenience of explanation, descriptions thereof different from the descriptions provided with reference to FIG. 9 or 12 will be principally provided.

With reference to FIG. 14, the semiconductor device 6 according to an example embodiment may include a substrate 11, a first active fin F1, a gate structure 20, and an embedded insulating layer 50e. The embedded insulating layer 50e may include an upper embedded insulating layer 51b and a lower embedded insulating layer 53 disposed therebelow. The semiconductor device 6 may further include a source region 41a disposed on one side of the gate structure 20, and a drain region 41b disposed on the other side of the gate structure 20 and disposed on one side of the embedded insulating layer 50e.

The embedded insulating layer 50e may be disposed below the gate structure 20 and may partially overlap the gate structure 20. In some embodiments, the gate structure 20 may partially overlap the embedded insulating layer 50e in a plan view as illustrated in FIG. 14.

The lower embedded insulating layer 53 may entirely fill the second trench t2, and the upper embedded insulating layer 51b may partially fill the first trench t1. A thickness of the upper embedded insulating layer 51b may be less than the depth D1 of the first trench t1. An upper surface of the upper embedded insulating layer 51b may be located at a lower level than an upper surface of the first active fin F1.

The upper embedded insulating layer 51b may be disposed separately from a sidewall of the first trench t1. A length of the upper embedded insulating layer 51b in the first direction X may be less than a length of the first trench t1 in the first direction X. The upper embedded insulating layer 51b having the structure described above may be formed in the case that the upper embedded insulating layer 51b is etched at a relatively high etching rate during a field recess process that will be described with reference to FIG. 23.

A portion of the gate structure 20 may fill a space formed as the upper embedded insulating layer 51b is separated from a sidewall of the first trench t1. A portion of a gate insulating layer 22 and a portion of a gate electrode 25 may be formed in the space formed as the upper embedded insulating layer 51b is separated from a sidewall of the first trench t1.

Figure 15:
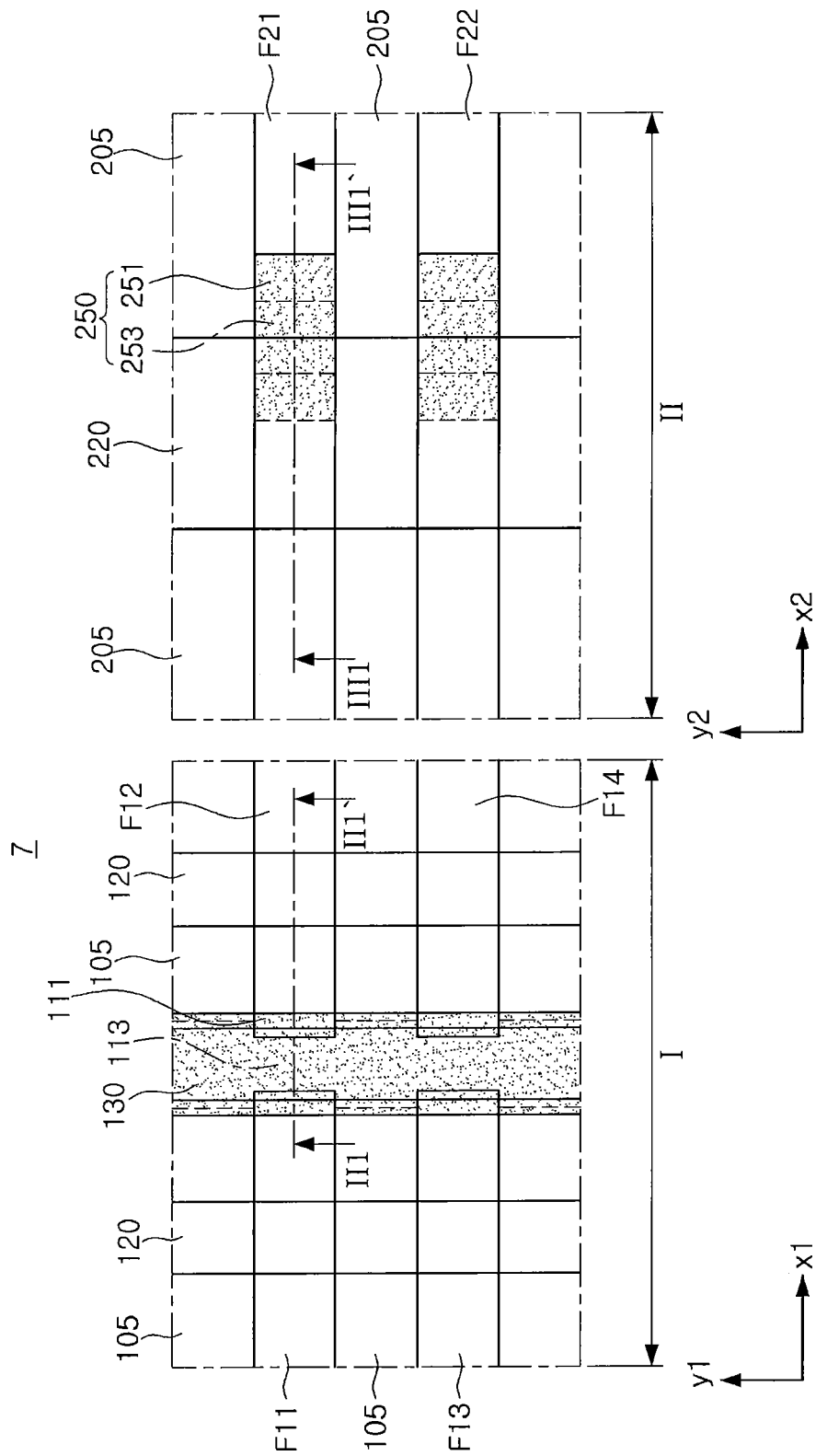
FIGS. 15 and 16 are a layout diagram and a perspective view of a semiconductor device according to an example embodiment of the present inventive concept.
Figure 16:
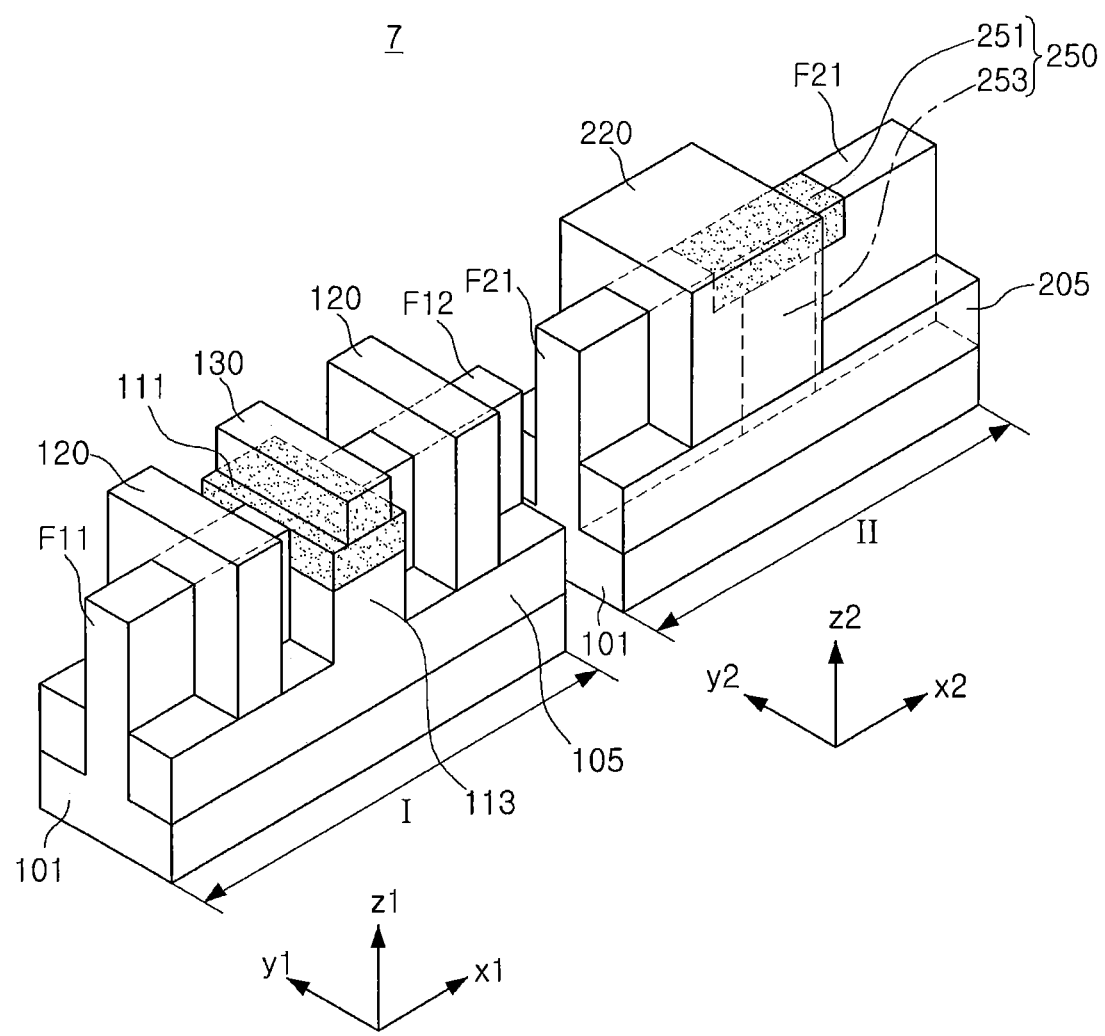
Figure 17:
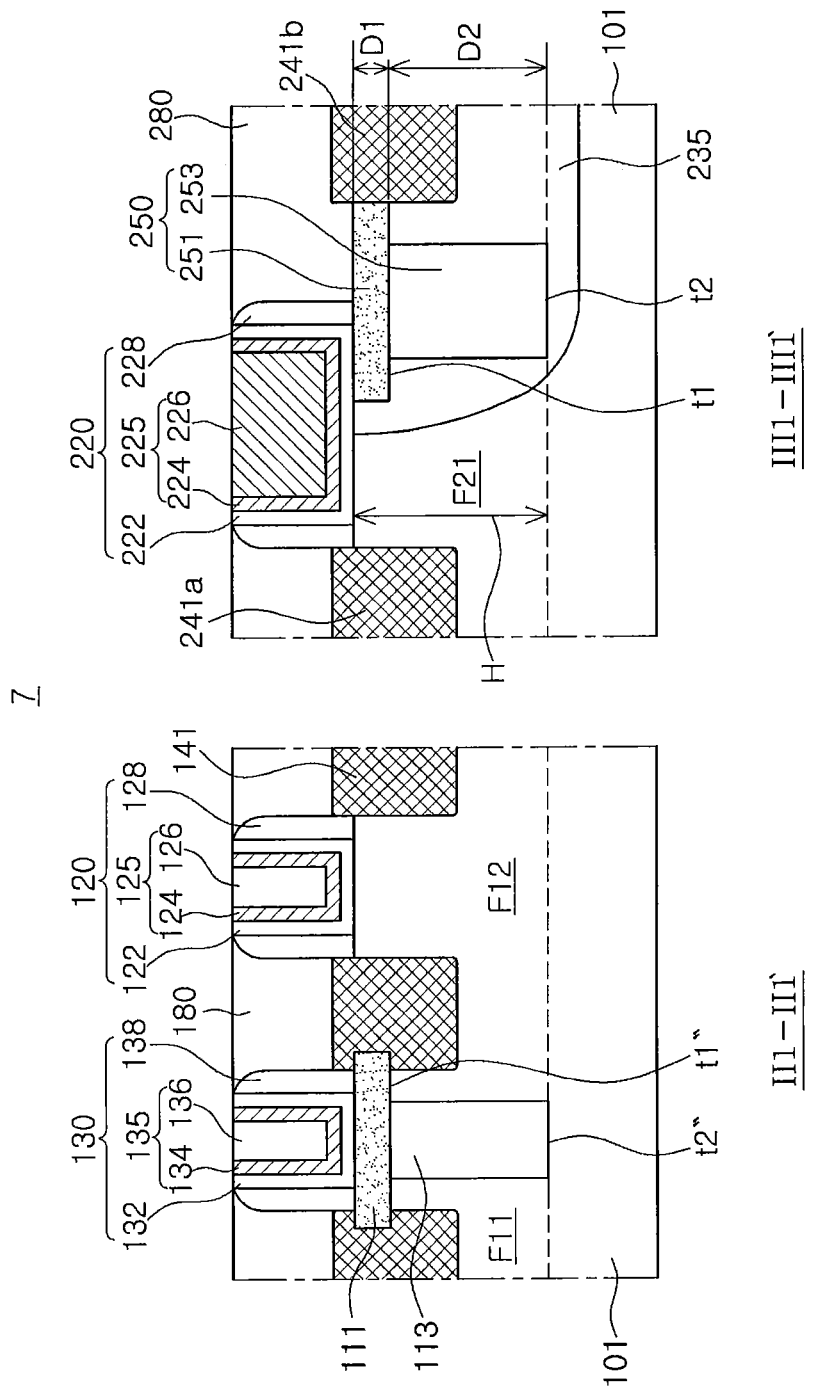
FIG. 17 is a cross-sectional view of a semiconductor device according to an example embodiment.

FIGS. 15 and 16 are a layout diagram and a perspective view of a semiconductor device according to an example embodiment. FIG. 17 is a cross-sectional view of a semiconductor device according to an example embodiment. FIG. 17 shows cross-sectional views taken along the lines II1-III1' and III1-III1' of FIG. 15.

With reference to FIGS. 15 to 17, a semiconductor device 7 according to an example embodiment may include a substrate 101, first to fourth active fins F11, F12, F13 and F14, fifth and sixth active fins F21 and F22, a first gate structure 120, a dummy gate structure 130, a second gate structure 220, first and second element isolation films 105 and 113, a capping insulating layer 111, a third element isolation film 205, and an embedded insulating layer 250.

The substrate 101 may include a first element region I and a second element region II. The substrate 101 may be the same type of substrate as the substrates 11 of FIGS. 2 and 3.

The first element region I may be a region in which fin-type transistors for a logic circuit are formed, and the second element region II may be a region in which a laterally double diffused metal-oxide-semiconductor (LDMOS) transistor having a FinFET structure is formed. The first to fourth active fins F11, F12, F13 and F14, the first gate structure 120, and the dummy gate structure 130 may be formed on the first element region I of the substrate 101. The fifth and sixth active fins F21 and F22, the second gate structure 220, and the embedded insulating layer 250 may be formed on the second element region II of the substrate 101. An x1 direction in FIGS. 15 to 17 may be the same direction as an x2 direction, and a y1 direction and a y2 direction may be the same direction. Similarly, a z1 direction and a z2 direction may be the same direction.

The first element region I will first be described below. The following description is based on the first active fin F11 and the second active fin F12 and may be identically applied to the third active fin F13 and the fourth active fin F14.

The first active fin F11 and the second active fin F12 may protrude from the substrate 101. The first active fin F11 and the second active fin F12 may extend lengthwise in the first direction x1. The first active fin F11 and the second active fin F12 are extended lengthwise in the first direction x1, and thus, each thereof may include a longer side extended in the first direction x1 and a shorter side extended in the second direction y1. In some embodiments, corner portions of the first active fin F11 and the second active fin F12 may be formed in a rounded shape in a manner different to the drawing.

The first active fin F11 and the second active fin F12 may be portions of the substrate 101 and may also include an epitaxial layer grown from the substrate 101.

The first active fin F11 and the second active fin F12 may include, for example, silicon (Si) or germanium (Ge), an elemental semiconductor material. In addition, the first active fin F11 and the second active fin F12 may include a compound semiconductor, and for example, may include a group IV-IV compound semiconductor or a group III-V compound semiconductor. The first and second element isolation films 105 and 113 may be formed on the substrate 100 and may be disposed in the vicinity of the first active fin F11 and the second active fin F12. For example, the first active fin F11 and the second active fin F12 may be defined by the first and second element isolation films 105 and 113. The first element isolation film 105 may be formed to surround lower portions of the first active fin F11 and the second active fin F12.

The first element isolation film 105 and the second element isolation film 113 having different heights may be formed. For example, the second element isolation film 113 may protrude to have an upper surface at a level that is higher than a level of an upper surface of the first element isolation film 105. A level of an upper surface of the first element isolation film 105 and a level of an upper surface of the second element isolation film 113 may be lower than levels of upper surfaces of the first active fin F11 and the second active fin F12.

The first element isolation film 105 may be formed to be in contact with a longer side of the first active fin F11 and a longer side of the second active fin F12. The second element isolation film 113 may be formed to be in contact with a shorter side of the first active fin F11 and a shorter side of the second active fin F12. The first element isolation film 105 may be formed to extend in the first direction x1, and the second element isolation film 113 may be formed to extend in the second direction y1. The second element isolation film 113 may fill a trench t2' between the shorter side of the first active fin F11 and the shorter side of the second active fin F12. The dummy gate structure 130 extended in the second direction may be formed above the second element isolation film 113.

A capping insulating layer 111 extended in the second direction y1 may be formed between the second element isolation film 113 and the dummy gate structure 130. The capping insulating layer 111 may fill a trench t1'' disposed below the dummy gate structure 130. A length of the capping insulating layer 111 in the first direction x1 may be greater than a length of the dummy gate structure 130. Thus, since the dummy gate structure 130 is stably disposed on the capping insulating layer 111, a bridge defect may be possibly prevented from occurring between the dummy gate structure 130 and a source/drain 141.

The first and second element isolation films 105 and 113 may be, for example, an oxide film, a nitride film, an oxynitride film, or a film of combination thereof. The first and second element isolation films 105 and 113 may be formed of, for example, flowable oxide (FOX), tonen silazen (TOSZ), or the like. The capping insulating layer 111 may be, for example, an oxide layer, a nitride layer, or an oxynitride layer having an etching rate lower than that of the first and second element isolation films 105 and 113. For example, the capping insulating layer may be formed of moderate temperature oxide (MTO).

The first gate structures 120 may extend in the second direction y1 to intersect the first active fin F11 and the second active fin F12, respectively. The first gate structures 120 may be disposed to surround upper portions of the first and second active fins F11 and F12 and may also be disposed on the second element isolation film 113. The dummy gate structure 130 may extend in the second direction y1 to be disposed on the second element isolation film 113 and the capping insulating layer 111.

The first gate structure 120 may include a first gate electrode 125, a first gate insulating layer 122, and a spacer 128. The dummy gate structure 130 may include a dummy gate electrode 135, a dummy gate insulating layer 132, and a dummy spacer 138.

The first gate insulating layer 122 may be disposed between the first and second active fins F11 and F12 and the first gate electrode 125 and may be disposed between the first gate electrode 125 and the spacer 128. The dummy gate insulating layer 132 may be disposed between the capping insulating layer 111 and the dummy gate electrode 135 and may be disposed between the dummy gate electrode 135 and the dummy spacer 138. The first gate insulating layer 122 and the dummy gate insulating layer 132 may include a high-k insulating layer.

An interface layer (not shown) may be further disposed between the first gate insulating layer 122 and the substrate 101 and between the dummy gate insulating layer 132 and the substrate 101 to improve interface characteristics therebetween. The interface layer may include, for example, a silicon oxide layer, a silicon oxynitride layer, or a layer of combinations thererof.

The first gate electrode 125 may include a first metal layer 124 and a second metal layer 126, and the dummy gate electrode 135 may include a first dummy metal layer 134 and a second dummy metal layer 136. The first metal layer 124 may serve to perform a work control function, and the second metal layer 126 may serve to fill a space formed by the first metal layer 124. For example, the first metal layer 124 may include at least one of TiN, WN, TiAl, TiAlN, TaN, TiC, TaC, TaCN, TaSiN, or combinations thereof, but is not limited thereto. In addition, the second metal layer 126 may include, for example, at least one of tungsten (W), aluminum (Al), copper (Cu), cobalt (Co), titanium (Ti), tantalum (Ta), poly-Si, or metal alloys, but is not limited thereto. The first dummy metal layer 134 may be formed of the same material as that of the first metal layer 124, and the second dummy metal layer 136 may be formed of the same material as that of the second metal layer 126, and may serve to fill a space formed by the first dummy metal layer 134.

The first gate electrode 125 and the dummy gate electrode 135 may be formed, for example, using a replacement process or a gate last process, but are not limited thereto.

The spacer 128 may be disposed on a sidewall of the first gate electrode 125 extended in the second direction y1. The dummy spacer 138 may be disposed on a sidewall of the dummy gate electrode 135 extended in the second direction y1. The spacer 128 and the dummy spacer 138 may include, for example, at least one of, for example, SiN, SiON, SiO$_2$, SiOCN, and combinations thereof.

The first source/drain regions 141 may be disposed on both sides of the first gate structure 120 and may be formed on the first active fin F11 and the second active fin F12. The first source/drain region 141 may include an epitaxial layer. The first source/drain region 141 may be a raised source/drain region. A level of an upper surface of the first source/drain region 141 may be higher than levels of bottom surfaces of the spacer 128 and the dummy spacer 138. The first source/drain region 141 may be in contact with the first spacer 128 or the dummy spacer 138.

In the case of a PMOS transistor, the first source/drain region 141 may include a compressive stress material. For example, the first active fin F11 is formed of silicon (Si), the compressive stress material may be a material having a relatively high lattice constant compared to that of Si, for example, SiGe. The compressive stress material may improve mobility of a channel region carrier by applying compressive stress to the first and second active fins F11 and F12.

In the case of an NMOS transistor, the first source/drain region 141 may include a tensile stress material. For example, the first active fin F11 is formed of silicon (Si), the tensile stress material may be a material having a relatively low lattice constant compared to that of Si, for example, SiC. The tensile stress material may improve the mobility of channel region carrier by applying tensile stress to the first and second active fins F11 and F12.

An interlayer insulating layer 180 may be formed on the first source/drain region 141. In addition, the interlayer insulating layer 180 may be formed to surround the first gate structure 120 and the dummy gate structure 130. The interlayer insulating layer 180 may include at least one of, for example, silicon oxide, silicon nitride, silicon oxynitride, and a low dielectric constant material (e.g., a material having a dielectric constant lower than that of silicon oxide).

A structure illustrated in the second element region II may be identical to the structure of the semiconductor device 3 of FIGS. 7 to 9. A description of the second element region II may be substituted with the description of the semiconductor device 3 with reference to FIGS. 7 to 9.

The fifth and sixth active fins F21 and F22 extended in a fourth direction x2 may correspond to the first and second active fins F1 and F2 of the semiconductor device 3, the second gate structure 220 extended in a fifth direction y2 may correspond to the gate structure 20 of the semiconductor device 3, and the embedded insulating layer 250 may correspond to the embedded insulating layer 50b of the semiconductor device 3. The third element isolation film 205 may correspond to the element isolation film 15 of the semiconductor device 3, and a drift region 235 may correspond to the drift region 35' of the semiconductor device 3.

In the case of the semiconductor device 7 of the example embodiment, an upper embedded insulating layer 251 and the capping insulating layer 111 may be formed simultaneously by the same process and may be located at the same level above an upper surface of the substrate 101. In addition, the upper embedded insulating layer 251 and the capping insulating layer 111 may be formed of the same material. The first element isolation film 105, the second element isolation film 113, and a lower embedded insulating layer 253 may be formed simultaneously by the same process and may be formed of the same material. An upper surface of the second element isolation film 113 and an upper surface of the lower embedded insulating layer 253 may have at the same level to have the same height.

A length of the second gate structure 220 in the fourth direction x2 may be greater than a length of the first gate structure 120 in the first direction x1.

FIGS. 18 to 24 are drawings illustrating a method of manufacturing the semiconductor device 7 described with reference to FIGS. 15 to 17. Hereinafter, for convenience of explanation, the first and second active fins F11 and F12 of FIG. 15, and the fifth active fin F21 will be principally described below. An x1 direction in FIGS. 18 to 24 may be the same direction as an x2 direction, and a y1 direction and a y2 direction may be the same direction. Similarly, a z1 direction and a z2 direction may be the same direction.

Figure 18:
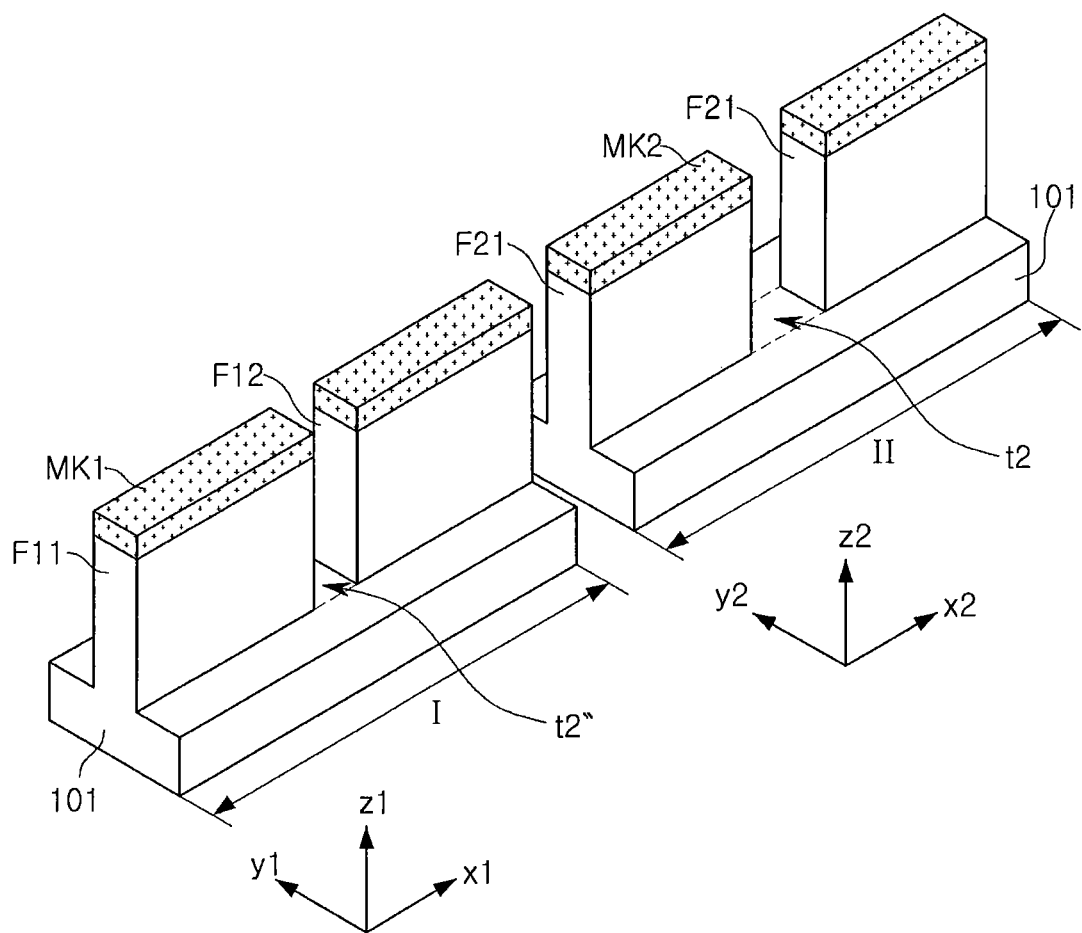
FIGS. 18 to 24 are drawings illustrating a method of manufacturing a semiconductor device according to an example embodiment of the present inventive concept.

Referring to FIG. 18, masks MK1 and MK2 may be formed on a substrate 101, and a first active fin F11 and a second active fin F12 may be formed on a first element region I using the mask MK1, and a fifth active fin F21 may be formed on a second element region II using the mask MK2.

In the first element region I, a shallow trench may be formed in the vicinity of the first and second active fins F11 and F12. A first trench t2" may be formed between a shorter side of the first active fin F11 and a shorter side of the second active fin F12.

In the second element region II, a shallow trench may be formed in the vicinity of the fifth active fin F21. In the second element region II, a second trench t2 formed by removing a portion of the fifth active fin F21 may be formed.

The shallow trench of the first element region I and the shallow trench of the second element region II may be formed to have the same depth. The first trench t2" and the second trench t2 may be formed to have the same depth as the shallow trench.

Although not illustrated in the drawing, a deep trench may be formed between the first element region I and the second element region II.

Figure 19:
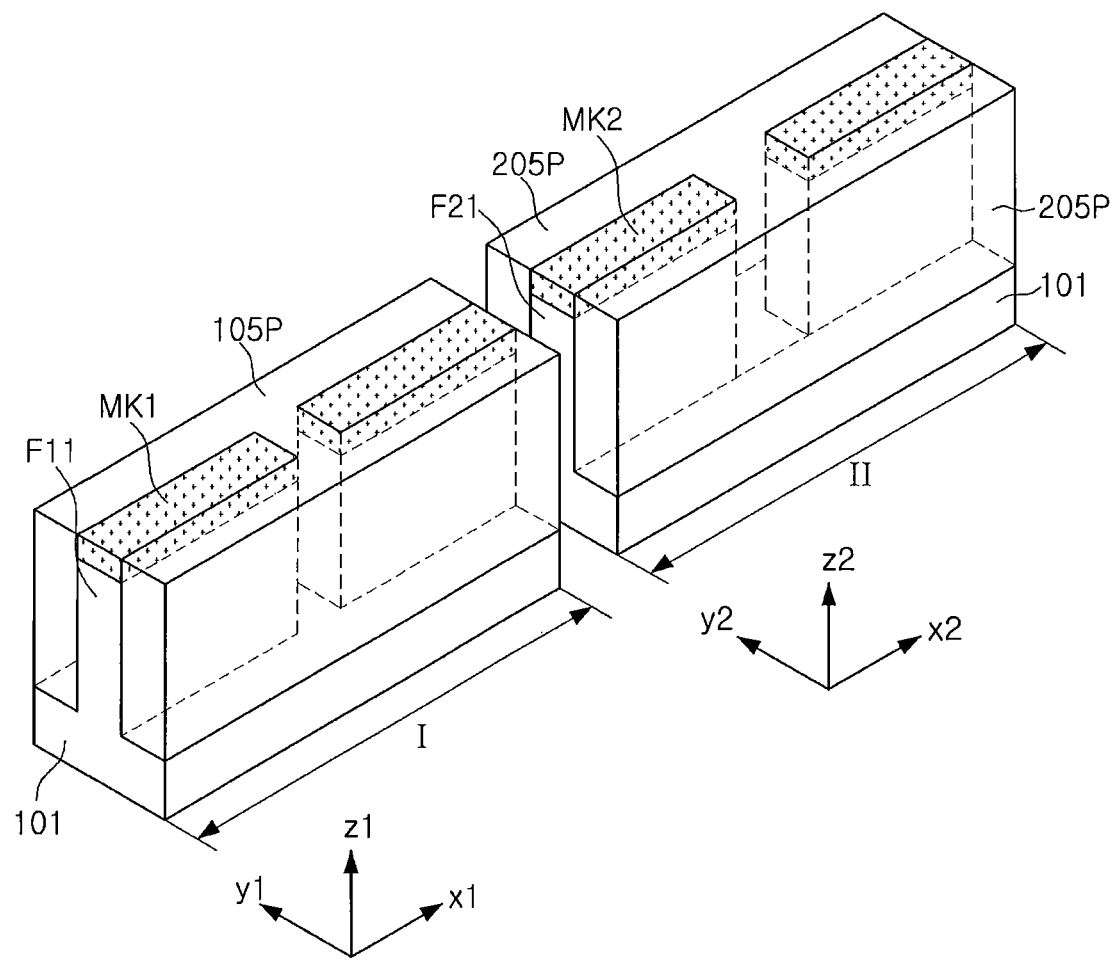

Referring to FIG. 19, preliminary element isolation films 105P and 205P may be formed to surround the active fins F11, F12 and F21, and the masks MK1 and MK2. In detail, the preliminary element isolation films 105P and 205P may be formed to sufficiently cover the active fins F11, F12, and F21 and the masks MK1 and MK2, and then a planarization process may be performed to allow upper surfaces of the masks MK1 and MK2 to be exposed. The preliminary element isolation films 105P and 205P may include at least one of, for example, silicon oxide, silicon nitride, silicon oxynitride, and combinations thereof. The preliminary element isolation films 105P and 205P may be formed of, for example, flowable oxide (FOX) or tonen silazen (TOSZ) having excellent gapfill characteristics, or the like.

Figure 20:
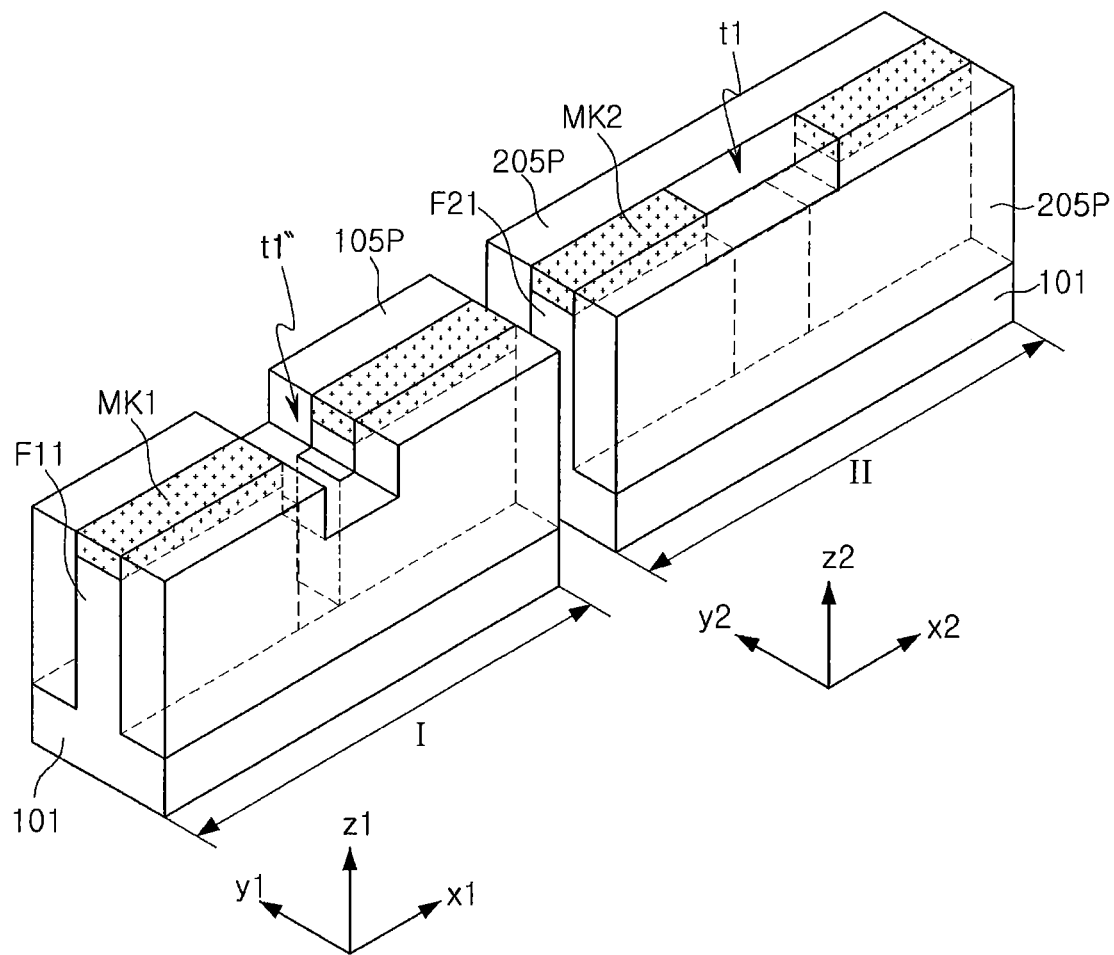

Referring to FIG. 20, a third trench t1" extended in the y1 direction may be formed on the first element region I by removing a portion of the mask MK1, portions of the first and second active fins F11 and F12, and a portion of the preliminary element isolation film 105P using a separate patterned mask in an etching process. The third trench t1" may be formed on the first trench t2".

In addition, a fourth trench t1 may be formed on the second element region II by removing a portion of the mask MK2, a portion of the fifth active fin F21, and a portion of the preliminary element isolation film 205P using a separate patterned mask in an etching process. The fourth trench t1 may be formed on the second trench t2.

Depths of the third and fourth trenches t1" and t1 may be shallower than a depth of the shallow trench, and the depths of the third and fourth trenches t1" and t1 may be the same as each other.

Figure 21:
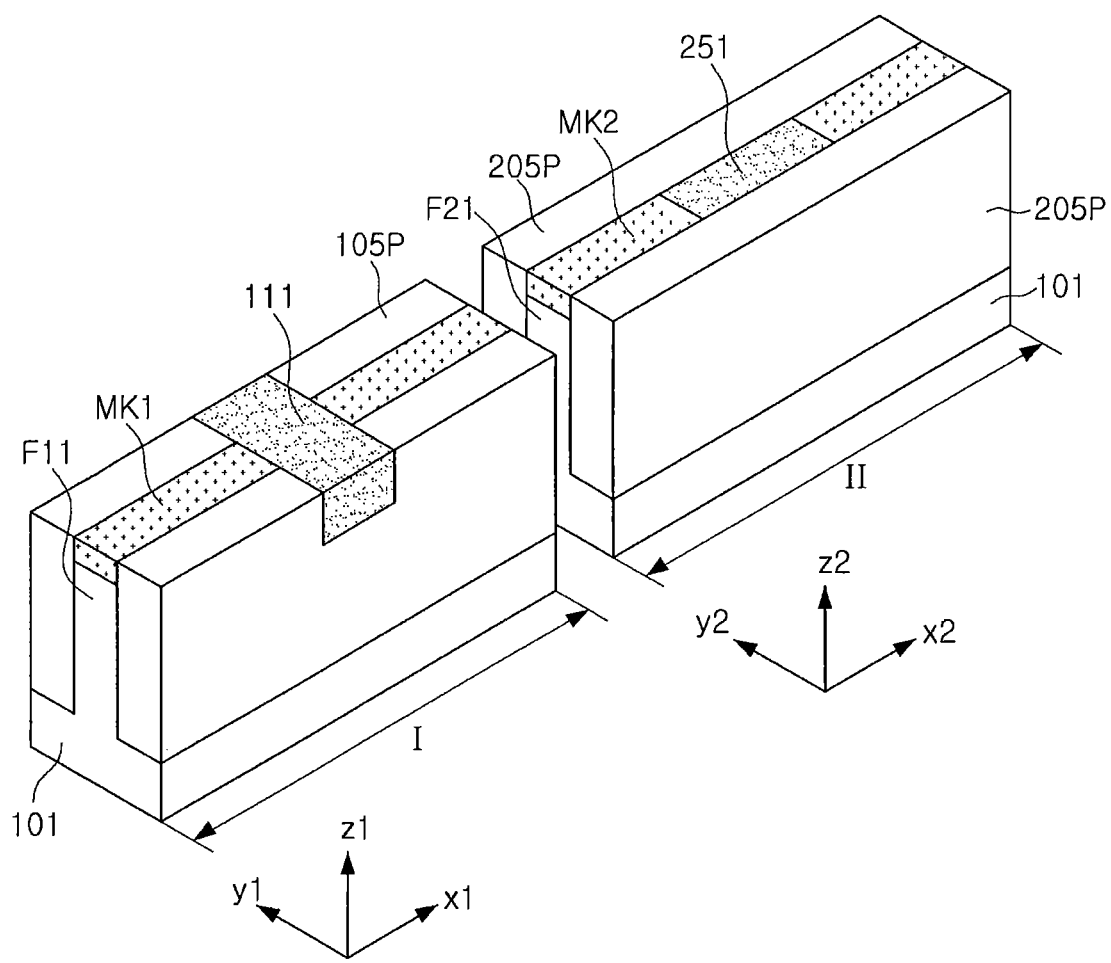

Referring to FIG. 21, a capping insulating layer 111 filling the third trench t1" and an upper embedded insulating layer 251 filling the fourth trench t1 may be formed simultaneously. In detail, an insulating layer may be formed to cover the masks MK1 and MK2, and a planarization process may then be performed to allow the masks MK1 and MK2 to be exposed. The capping insulating layer 111 and the upper embedded insulating layer 251 may include at least one of, for example, silicon oxide, silicon nitride, silicon oxynitride, and combinations thereof. The capping insulating layer 111 and the upper embedded insulating layer 251 may have an etching rate lower than that of the preliminary element isolation films 105P and 205P. For example, the capping insulating layer 111 and the upper embedded insulating layer 251 may be medium temperature oxide (MTO) layers.

Figure 22:
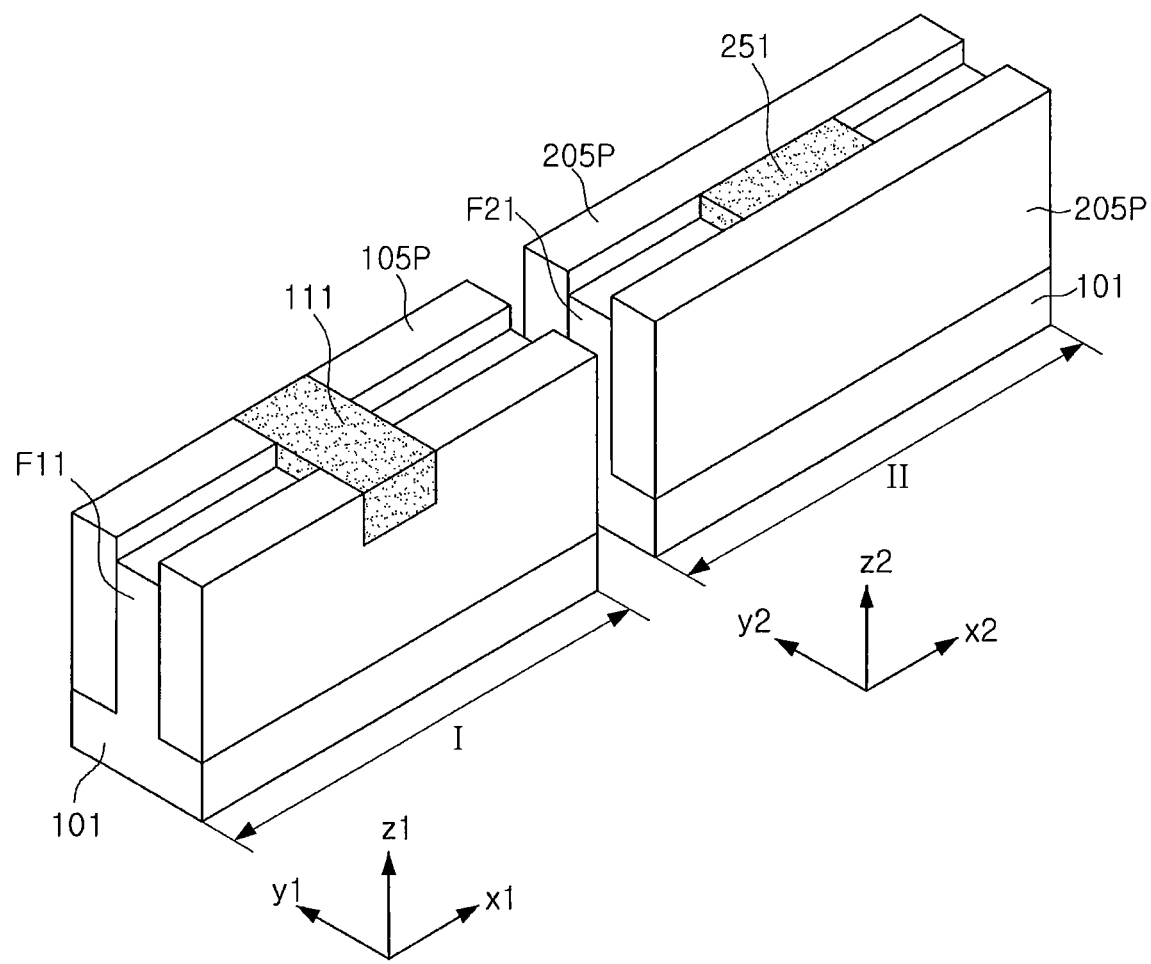

Referring to FIG. 22, the masks MK1 and MK2 may be removed. The masks MK1 and MK2 may be removed using, for example, a wet etching process. In this case, the preliminary element isolation films 105P and 205P, the capping insulating layer 111, and the upper embedded insulating layer 251 may also partially be etched.

Figure 23:
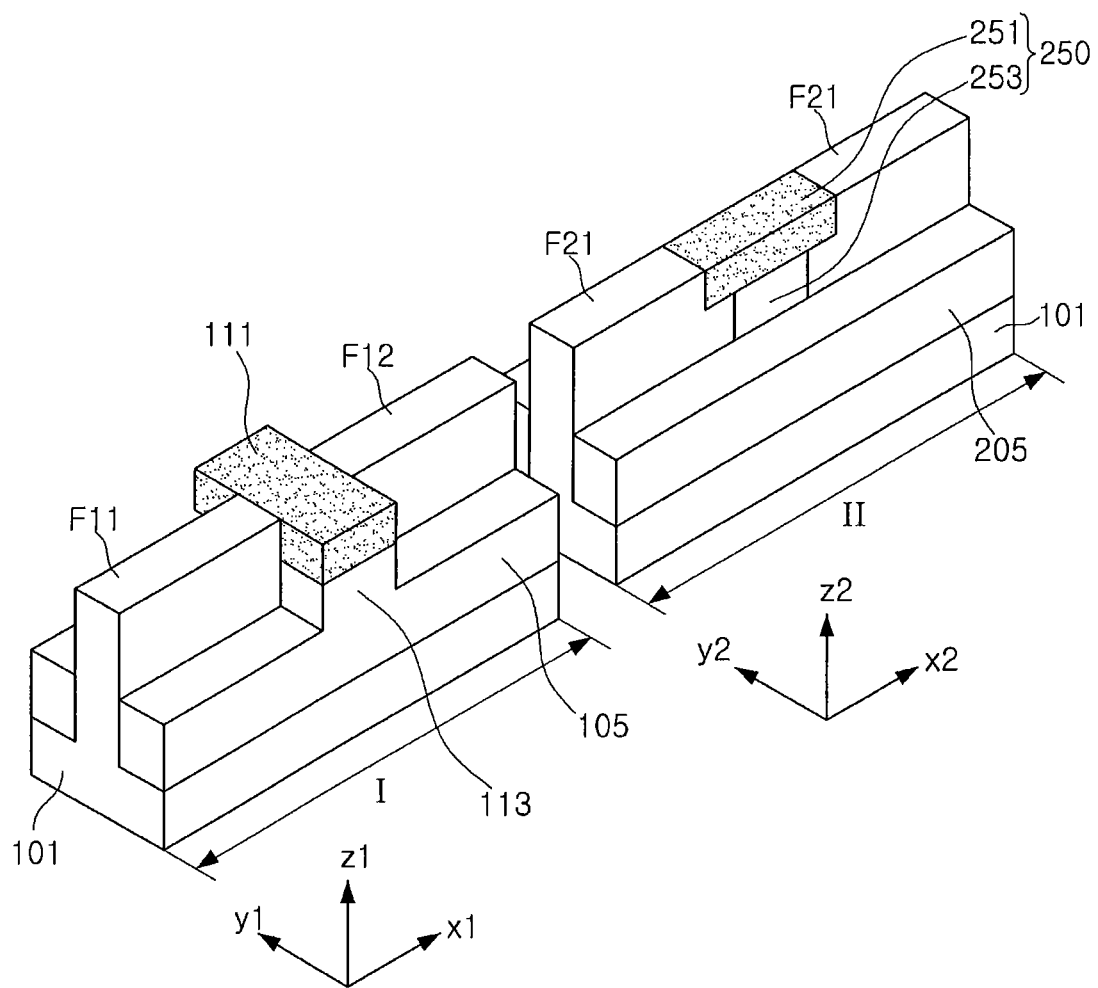

Referring to FIG. 23, the preliminary element isolation films 105P and 205P may be etched using a field recess process to form the first element isolation film 105 and the second element isolation film 113 in the first element region I and to form the lower embedded insulating layer 253 and the third element isolation film 205 in the second element region II, simultaneously.

Since the preliminary element isolation film 105P below the capping insulating layer 111 is not etched during a field recess process, the second element isolation film 113 may be formed. Thus, the first element isolation film 105 and the second element isolation film 113 having different heights may be formed. In some embodiments, an upper surface of the second element isolation film 113 may be higher than an upper surface of the first element isolation film 105 relative to the substrate 101 as illustrated in FIG. 23.

Since the preliminary element isolation film 205P below the upper embedded insulating layer 251 is not etched during the field recess process, the lower embedded insulating layer 253 may be formed.

In this case, the capping insulating layer 111 and the upper embedded insulating layer 251 having an etching rate lower than that of the preliminary element isolation films 105P and 205P may be partially etched, and thus, an upper surface of the capping insulating layer 111 and an upper surface of the upper embedded insulating layer 251 may be located on the same level as upper surfaces of the active fins F11, F12, and F21. The capping insulating layer 111 and the upper embedded insulating layer 251 may have the same level of upper surfaces to have the same height. In some embodiments, the upper surface of the capping insulating layer 111, the upper surface of the upper embedded insulating layer 251, and the upper surfaces of the active fins F11, F12, and F21 may be coplanar as illustrated in FIG. 23.

Figure 24:
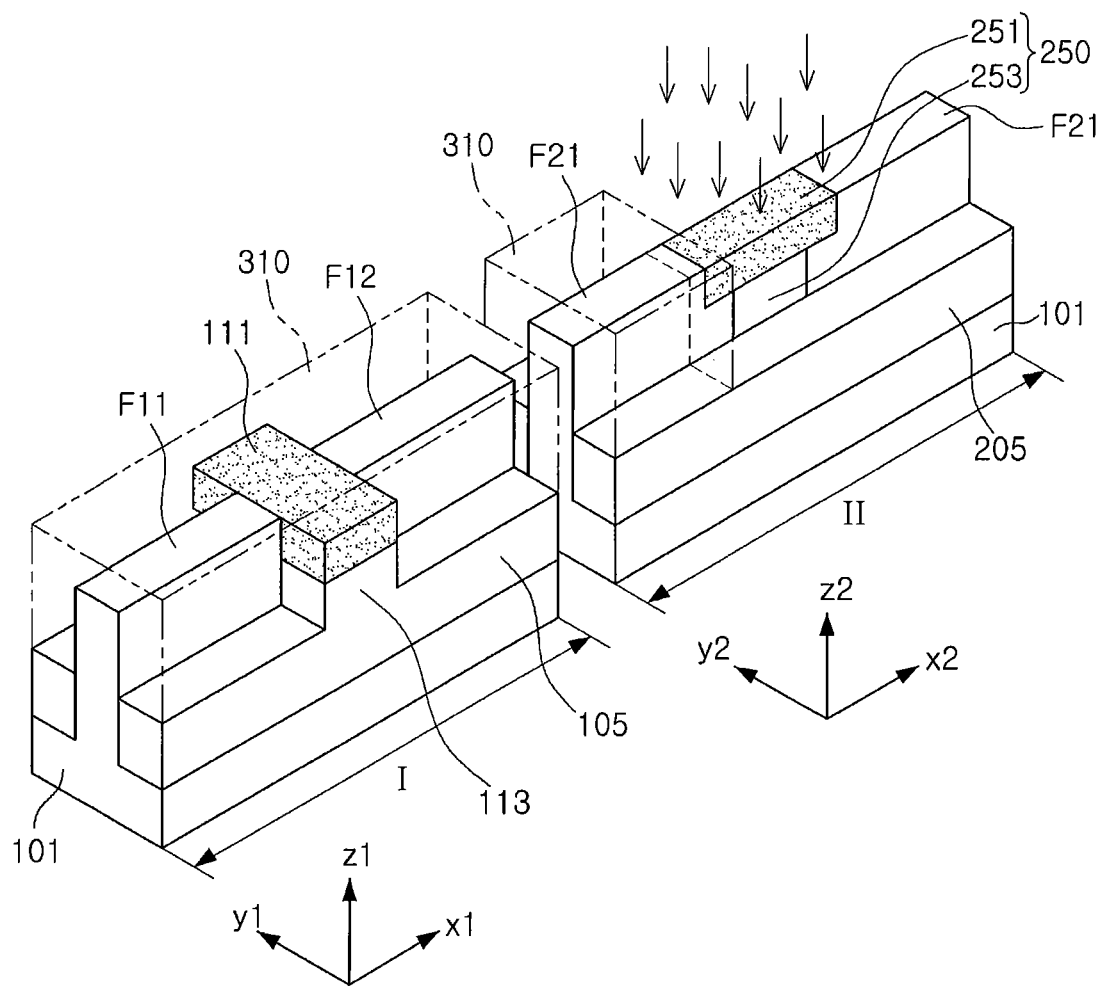

Referring to FIG. 24, a protective layer 310 may be formed to cover the entirety of the first element region I and a portion of the second element region II, and an ion implantation process for the formation of the drift region 235 (see FIG. 17) may be performed. The drift region 235 may be a lightly doped drain (LDD). The protective layer 310 may be formed not to cover the upper embedded insulating layer 251 of the second element region II. The protective layer 310 may be formed of, for example, a photosensitive film pattern, but is not limited thereto. The protective layer 310 may be removed after the ion implantation process is performed.

Referring again to FIGS. 16 and 17, the first gate structures 120 may be formed on the first active fin F11 and the second active fin F12, the dummy gate structure 130 may be formed on the second element isolation film 113 and the capping insulating layer 111, and the second gate structure 220 may be formed on the fifth active fin F21 and the embedded insulating layer 250. The first gate structure 120, the dummy gate structure 130, and the second gate structure 220 may be formed, for example, using a gate replacement process.

Before the gate replacement process is performed, the source/drain regions 141 may be formed on sides of the first gate structure 120 and the dummy gate structure 130, and the source region 241a and the drain region 241b may be formed on sides of the second gate structure 220. The source/drain regions 141 may be formed in the first active fin F11 and the second active fin F12 adjacent the sides of the first gate structures 120 and the dummy gate structure 130. The source region 241a and the drain region 241b may be formed in the fifth active fin F21 adjacent the sides of the second gate structure 220, respectively.

Figure 25:
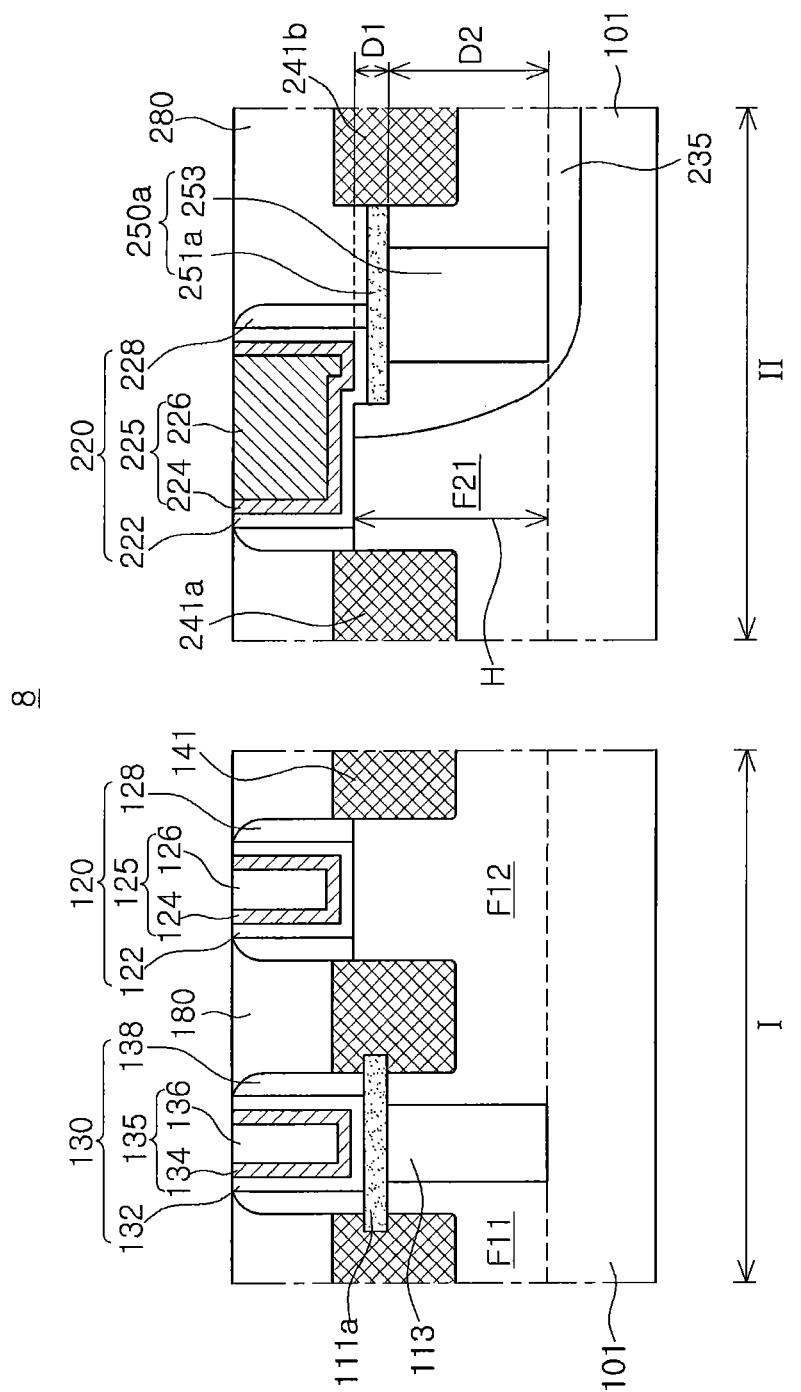
FIGS. 25 to 29 are cross-sectional views of a semiconductor device according to example embodiments of the present inventive concept.

FIG. 25 is a cross-sectional view of a semiconductor device according to an example embodiment. FIG. 25 shows cross-sectional views of the first element region I and the second element region II of the semiconductor device. A semiconductor device 8 according to an example embodiment with reference to FIG. 25 is a modified example of the semiconductor device 7 of FIG. 17, and thus, a difference therebetween will be briefly described below.

Referring to FIG. 25, in the case of the semiconductor device 8, compared to the semiconductor device 7, a thickness of a capping insulating layer 111a of the first element region I may be relatively thin, and a thickness of an upper embedded insulating layer 251a of the second element region II may be relatively thin. Thus, a level of an upper surface of the capping insulating layer 111a may be lower than levels of upper surfaces of the first and second active fins F11 and F12, and a level of an upper surface of the upper embedded insulating layer 251a may be lower than a level of an upper surface of the fifth active fin F21.

Figure 26:
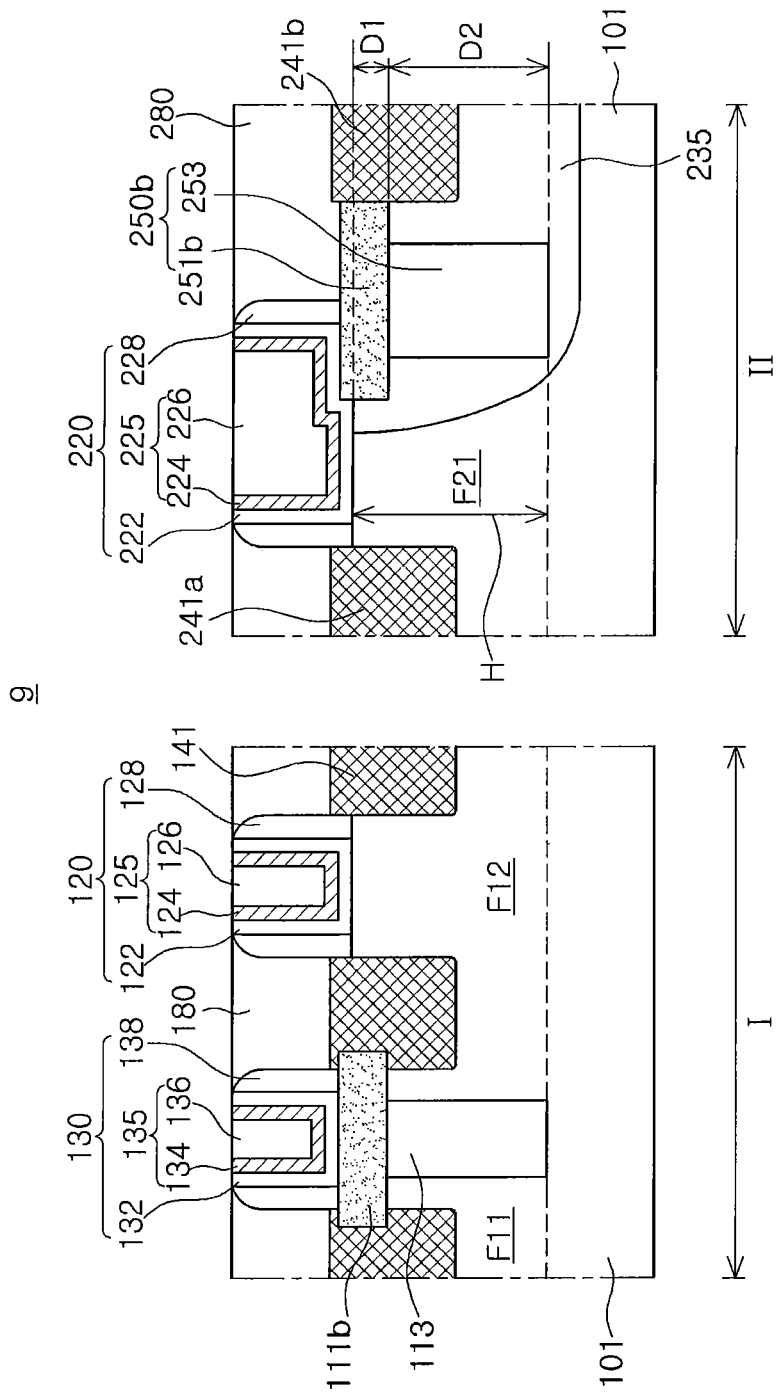

FIG. 26 is a cross-sectional view of a semiconductor device according to an example embodiment. A semiconductor device 9 according to an example embodiment with reference to FIG. 26 is a modified example of the semiconductor device 7 of FIG. 17, and thus, a difference therebetween will be briefly described below.

Referring to FIG. 26, in the case of the semiconductor device 9, compared to the semiconductor device 7, a thickness of a capping insulating layer 111a of the first element region I may be relatively thick, and in the structure of an LDMOS transistor having a FinFET structure of the second element region II, a thickness of an upper embedded insulating layer 251b may be relatively thick. Thus, a level of an upper surface of the capping insulating layer 111b is higher than a level of upper surfaces of the first and second active fins F11 and F12, and a level of an upper surface of the upper embedded insulating layer 251b may be higher than that of an upper surface of the fifth active fin F21.

Figure 27:
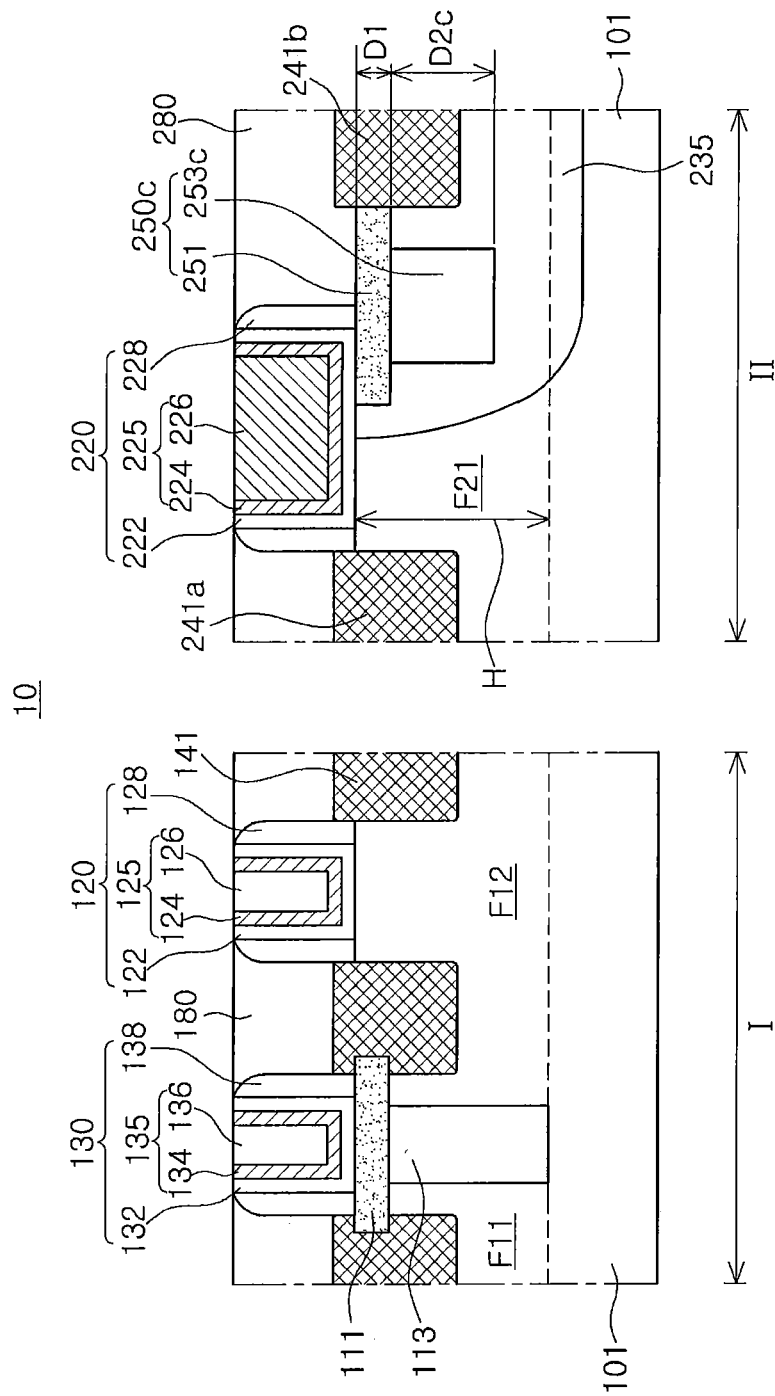

FIG. 27 is a cross-sectional view of a semiconductor device according to an example embodiment. A semiconductor device 10 according to an example embodiment with reference to FIG. 27 is a modified example of the semiconductor device 7 of FIG. 17, and thus, a difference therebetween will be briefly described below.

Referring to FIG. 27, in the case of the semiconductor device 10, an LDMOS transistor having a FinFET structure in the second element region II may have the same structure as the semiconductor device 5 of FIG. 13, in a manner different from that of the semiconductor device 7. For example, the semiconductor device 10 may have a structure in which a thickness of a lower embedded insulating layer 253c is reduced as compared to the case of the semiconductor device 7.

Figure 28:
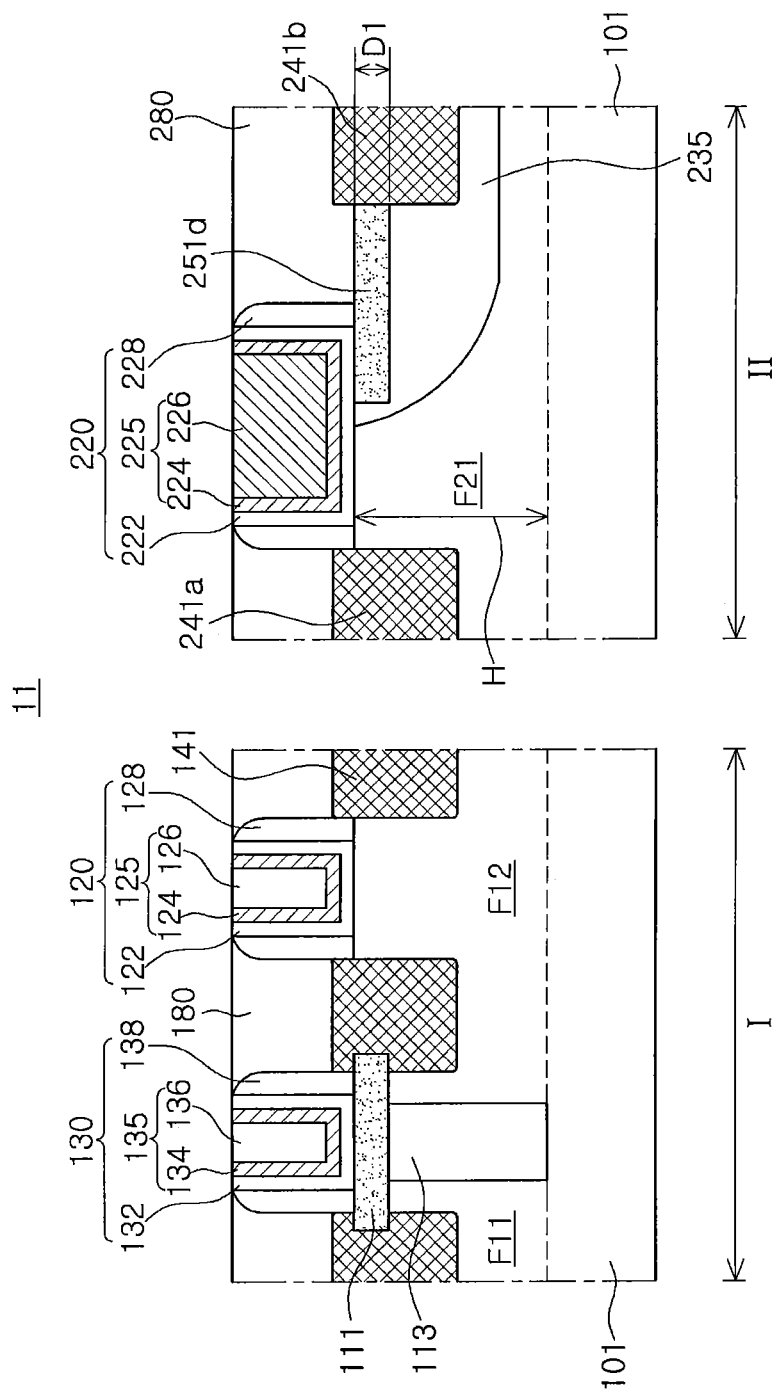

FIG. 28 is a cross-sectional view of a semiconductor device according to an example embodiment. A semiconductor device 11 according to an example embodiment with reference to FIG. 28 is a modified example of the semiconductor device 7 of FIG. 17, and a difference therebetween will only be briefly described below.

Referring to FIG. 28, in the case of the semiconductor device 11, an LDMOS transistor having a FinFET structure in the second element region II may have the same structure as the semiconductor device 1 of FIG. 3A, in a manner different from that of the semiconductor device 7. For example, in the second element region II of the semiconductor device 11, an LDMOS transistor having a FinFET structure in which only an upper embedded insulating layer is formed may be provided, without a lower embedded insulating layer.

In the example embodiment, a fifth active fin F21 may correspond to the first active fin F1 of the semiconductor device 1, a second gate structure 220 may correspond to the gate structure 20 of the semiconductor device 1, and an embedded insulating layer 251d may correspond to the embedded insulating layer 50 of the semiconductor device 1. A drift region 235 may correspond to the drift region 35 of the semiconductor device 1.

Figure 29:
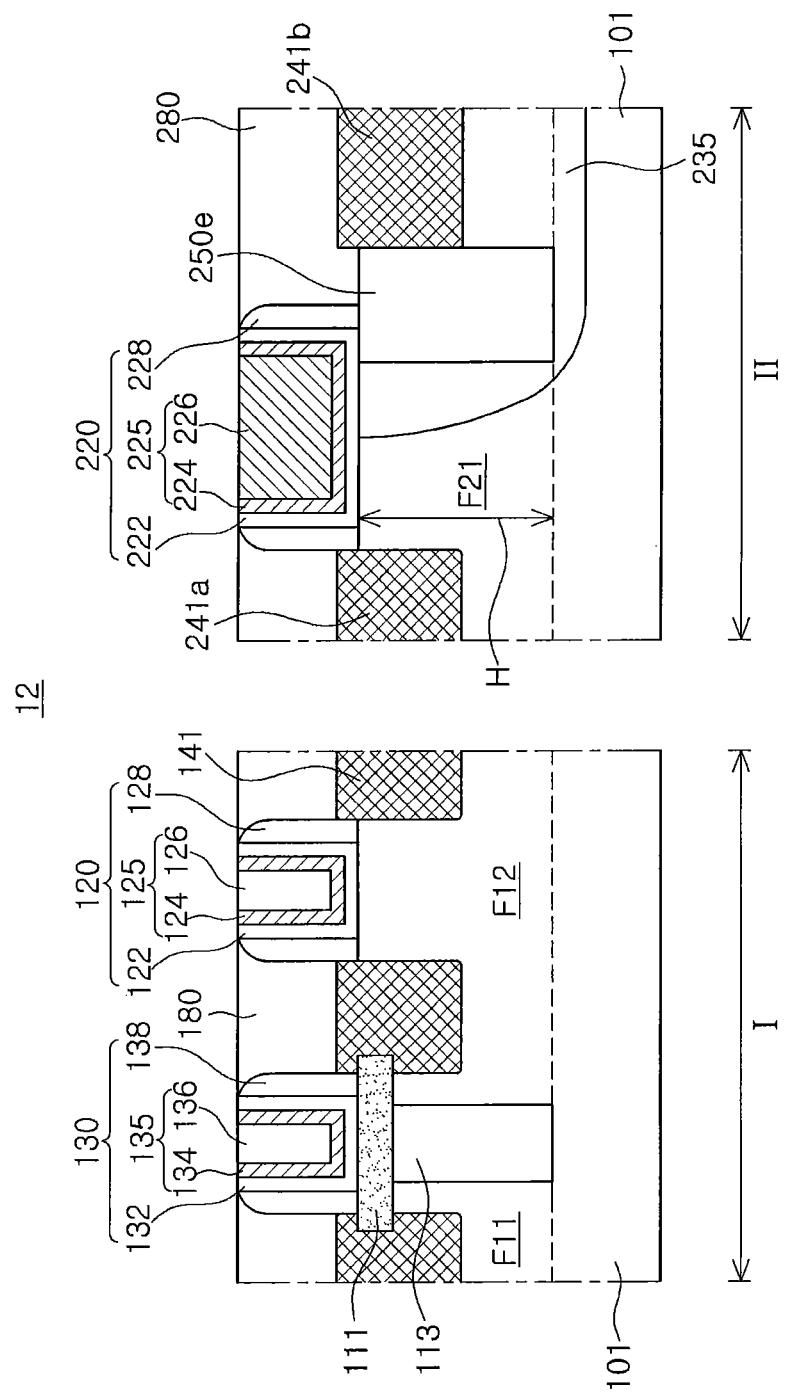

FIG. 29 is a cross-sectional view of a semiconductor device according to an example embodiment. A semiconductor device 12 according to an example embodiment with reference to FIG. 29 is a modified example of the semiconductor device 7 of FIG. 17, and a difference therebetween will only be briefly described below.

With reference to FIG. 29, in the case of the semiconductor device 12, an LDMOS transistor having a FinFET structure in the second element region II may include an embedded insulating layer 250e. A thickness of the embedded insulating layer 250e may be identical to (e.g., substantially equal to) a height of the fifth active fin F21. The embedded insulating layer 250e may partially overlap the gate structure 220. In some embodiments, the gate structure 220 may partially overlap the embedded insulating layer 250e in a plan view as illustrated in FIG. 29. The embedded insulating layer 250e may be in contact with a drain region 241b. The drift region 235 may extend to a lower portion of the gate structure 220 while surrounding the drain region 241b and the embedded insulating layer 250e. The drain region 241b and the embedded insulating layer 250e may be disposed in the drift region 235.

Figure 30:
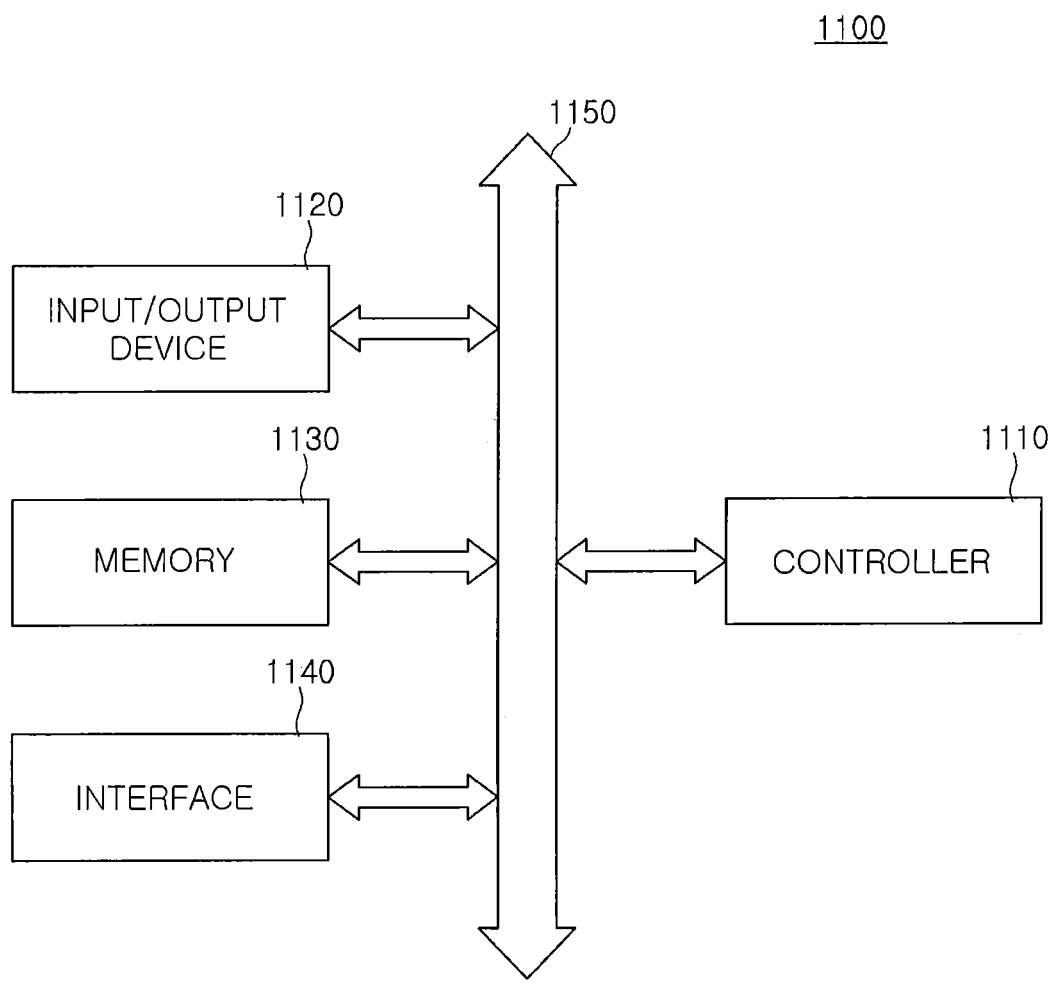
FIG. 30 is a block diagram of an electronic system including a semiconductor device according to example embodiments of the present inventive concept.

FIG. 30 is a block diagram of an electronic system including a semiconductor device according to example embodiments of the present inventive concept.

Referring to FIG. 30, an electronic system 1100 according to an example embodiment may include a controller 1110, an input/output device (I/O) 1120, a memory unit 1130, an interface 1140, and a bus 1150. The controller 1110, the input/output device 1120, the memory device 1130, and/or the interface 1140 may be combined with one another through the bus 1150. The bus 1150 may refer to a path of movement of data.

The controller 1110 may include at least one of a microprocessor, a digital signal processor, a microcontroller, and logic devices capable of performing functions similar thereto. Examples of the input/output device 1120 may include a keypad, a keyboard, a display device, and the like. The memory device 1130 may store data and/or a command, and the like. The interface 1140 may perform a function of transmitting data to a communications network or receiving data therefrom. The interface 1140 may have a wired or wireless form. For example, the interface 1140 may include an antenna, a wired/wireless transceiver, or the like.

Although not illustrated in the drawing, the electronic system 1100 may further include a high-speed dynamic random access memory (DRAM) and/or static random access memory (SRAM), and the like, as an operating memory to improve operations of the controller 1110.

A semiconductor device according to example embodiments of the present inventive concept described above may be provided in the memory device 1130, or may be provided as portions of the controller 1110, the input/output device (I/O) 1120, and the like.

The electronic system 1100 may be applied to a personal digital assistant (PDA), a portable computer, a web tablet, a wireless phone, a mobile phone, a digital music player, a memory card, or all types of electronic products capable of transmitting and/or receiving information in a wireless environment.

As set forth above, a high-frequency semiconductor device useful for a device miniaturization may be provided.

While example embodiments have been shown and described above, it will be apparent to those skilled in the art that modifications and variations could be made without departing from the scope of the present inventive concept as defined by the appended claims. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   at least one first active fin extending in a first direction on a substrate;
   a first element isolation film on a lower portion of the at least one first active fin;
   a gate structure extending in a second direction that is different from the first direction and crossing over the at least one first active fin, the gate structure comprising first and second sides that are spaced apart from each other in the first direction;
   a source region in the at least one first active fin adjacent the first side of the gate structure;
   a drift region in the at least one first active fin adjacent the second side of the gate structure, the drift region having a first impurity concentration, and the gate structure overlapping a portion of the drift region in a plan view;
   a drain region in the drift region and having a second impurity concentration that is higher than the first impurity concentration;
   a first trench in the drift region between the gate structure and the drain region, the gate structure overlapping a portion of the first trench in the plan view, and the first trench having a depth less than a height of the at least one first active fin;
   a lower embedded insulating layer in the drift region; and
   an upper embedded insulating layer that is in the drift region and is between the lower embedded insulating layer and the gate structure,
   wherein a lower surface of the upper embedded insulating layer has a first width in the first direction, an upper surface of the lower embedded insulating layer has a second width in the first direction, and the first width is greater than the second width, and
   wherein a sidewall of the upper embedded insulating layer and a sidewall of the lower embedded insulating layer are not coplanar.

2. The semiconductor device of claim 1, wherein the substrate comprises a first region and a second region,
   wherein the at least one first active fin, the first element isolation film, the gate structure, the source region, the drift region, the drain region, the first trench, the upper embedded insulating layer, and the lower embedded insulating layer are on the second region of the substrate, and
   wherein the semiconductor device further comprises:
      a plurality of second active fins extending in the first direction;
      a second element isolation film between first and second ones of the plurality of second active fins and having a height higher than a height of the first element isolation film;
      a capping insulating layer on the second element isolation film and comprising a same material as a material of the upper embedded insulating layer; and
      a dummy gate structure on the capping insulating layer,
   wherein the plurality of second active fins, the second element isolation film, the capping insulating layer, and the dummy gate structure are on the first region of the substrate.

3. The semiconductor device of claim 2, wherein the upper embedded insulating layer and the capping insulating layer are formed simultaneously by a same process, and an upper surface of the upper embedded insulating layer is coplanar with an upper surface of the capping insulating layer.

4. The semiconductor device of claim 2, further comprising a second trench under the first trench, wherein the second trench is filled with the lower embedded insulating layer, and the first trench has a width in the first direction that is longer than a width of the second trench in the first direction.

5. The semiconductor device of claim 2, wherein the second element isolation film and the lower embedded insulating layer are formed simultaneously by a same process, and an upper surface of the second element isolation film is coplanar with the upper surface of the lower embedded insulating layer.

6. The semiconductor device of claim 2, wherein a sum of a thickness of the upper embedded insulating layer and a thickness of the lower embedded insulating layer is equal to the height of the at least one first active fin.

7. The semiconductor device of claim 1, wherein an upper surface of the upper embedded insulating layer is coplanar with an upper surface of the at least one first active fin.

8. The semiconductor device of claim 1, wherein the upper embedded insulating layer has an upper surface that is lower than an upper surface of the at least one first active fin, and the upper embedded insulating layer is spaced apart from a sidewall of the first trench.

9. The semiconductor device of claim 8, wherein a portion of the gate structure fills a space between the sidewall of the first trench and the upper embedded insulating layer.

10. A semiconductor device comprising:
a first element region comprising:
a plurality of first active fins extending in a first direction;
a first trench between first and second ones of the plurality of first active fins;
a first element isolation film on respective opposing sides of the first and second ones of the plurality of first active fins and a second element isolation film in the first trench, the first and second element isolation films having different heights;
a capping insulating layer on the second element isolation film;
a dummy gate structure on the capping insulating layer; and
a first gate structure on the first one of the plurality of first active fins and the first element isolation film; and
a second element region comprising:
at least one second active fin extending in the first direction and comprising a source region and a drain region;
a second trench in the at least one second active fin;
an upper embedded insulating layer in the second trench;
a second gate structure on the at least one second active fin and overlapping a portion of the upper embedded insulating layer in a plan view; and
a drift region in the at least one second active fin, the second gate structure overlapping a portion of the drift region in the plan view, the drain region and the upper embedded insulating layer being in the drift region, and the drift region having a doping concentration lower than a doping concentration of the drain region.

11. The semiconductor device of claim 10, wherein a depth of the second trench is shallower than a depth of the first trench.

12. The semiconductor device of claim 10, further comprising a third trench under the second trench, wherein the third trench is filled with a lower embedded insulating layer, and a sum of a depth of the second trench and a depth of the third trench is equal to a depth of the first trench.

13. The semiconductor device of claim 12, wherein the first element isolation film, the second element isolation film, and the lower embedded insulating layer are formed simultaneously by a same process.

14. The semiconductor device of claim 10, wherein a length of the second gate structure in the first direction is greater than a length of the first gate structure in the first direction.

15. A semiconductor device comprising:
an active fin protruding from an upper surface of a substrate and extending in a first direction;
a gate structure crossing over the active fin and extending in a second direction that is different from the first direction;
a drift region in the active fin adjacent a side of the gate structure, the drift region comprising first impurities having a first conductivity type, and the gate structure partially overlapping the drift region in a plan view;
an upper embedded insulating layer in the drift region, the upper embedded insulating layer comprising first and second sides spaced apart from each other in the first direction, the gate structure partially overlapping the upper embedded insulating layer in the plan view and overlapping the first side of the upper embedded insulating layer in the plan view;
a lower embedded insulating layer in the drift region, wherein the upper embedded insulating layer extends between the gate structure and the lower embedded insulating layer, and wherein the upper embedded insulating layer has a first thickness, the lower embedded insulating layer has a second thickness that is greater than the first thickness; and
a drain region in the drift region adjacent the second side of the upper embedded insulating layer, the drain region comprising second impurities having the first conductivity type,
wherein the lower embedded insulating layer comprises a first side and a second side that is spaced apart from the first side of the lower embedded insulating layer in the first direction, the second side of the lower embedded insulating layer faces a side of the drain region, and is spaced apart from the side of the drain region,
wherein a portion of the drift region is between the second side of the lower embedded insulating layer and the side of the drain region, and
wherein the first side of the upper embedded insulating layer and the first side of the lower embedded insulating layer are not coplanar.

16. The semiconductor device of claim 15, wherein the gate structure does not overlap the drain region in the plan view.

17. The semiconductor device of claim 16, wherein the second side of the upper embedded insulating layer directly contacts the drain region.

18. The semiconductor device of claim 15, wherein a lower surface of the lower embedded insulating layer is coplanar with the upper surface of the substrate.

19. The semiconductor device of claim 1, wherein the lower surface of the upper embedded insulating layer directly contacts the upper surface of the lower embedded insulating layer.

* * * * *